US010114751B1

(12) United States Patent
Faith et al.

(10) Patent No.: US 10,114,751 B1
(45) Date of Patent: Oct. 30, 2018

(54) METHOD AND SYSTEM FOR IMPLEMENTING CACHE SIZE ESTIMATIONS

(71) Applicant: Nutanix, Inc., San Jose, CA (US)

(72) Inventors: Rickard Edward Faith, Hillsborough, NC (US); Peter Scott Wyckoff, Durham, NC (US)

(73) Assignee: Nutanix, Inc., San Jose, CA (US)

( * ) Notice: Subject to any disclaimer, the term of this patent is extended or adjusted under 35 U.S.C. 154(b) by 179 days.

(21) Appl. No.: 15/169,381

(22) Filed: May 31, 2016

Related U.S. Application Data

(60) Provisional application No. 62/171,671, filed on Jun. 5, 2015.

(51) Int. Cl.
*G06F 12/08* (2016.01)
*G06F 12/0871* (2016.01)

(52) U.S. Cl.
CPC .. *G06F 12/0871* (2013.01); *G06F 2212/1021* (2013.01); *G06F 2212/604* (2013.01)

(58) Field of Classification Search
CPC ....... G06F 2212/601; G06F 2212/1021; G06F 11/3447; G06F 11/3466; G06F 12/0871; G06F 2201/88; G06F 11/3452; G06F 11/3616; G06F 2212/604
See application file for complete search history.

(56) References Cited

U.S. PATENT DOCUMENTS

| | | |
|---|---|---|
| 8,549,518 B1 | 10/2013 | Aron et al. |
| 8,601,473 B1 | 12/2013 | Aron et al. |
| 8,850,130 B1 | 9/2014 | Aron et al. |
| 8,997,097 B1 | 3/2015 | Aron et al. |
| 9,052,936 B1 | 6/2015 | Aron et al. |
| 9,256,374 B1 | 2/2016 | Aron et al. |
| 9,256,475 B1 | 2/2016 | Aron et al. |
| 9,354,912 B1 | 5/2016 | Aron et al. |
| 9,389,887 B1 | 7/2016 | Aron et al. |
| 9,575,784 B1 | 2/2017 | Aron et al. |
| 9,619,257 B1 | 4/2017 | Aron et al. |
| 2013/0138889 A1* | 5/2013 | Chockler ............ G06F 12/0866 711/129 |
| 2014/0281249 A1* | 9/2014 | Waldspurger ....... G06F 12/0802 711/129 |
| 2016/0140052 A1* | 5/2016 | Waldspurger ......... G06F 12/121 711/129 |
| 2017/0060769 A1* | 3/2017 | Wires .................. H04L 12/6418 |

OTHER PUBLICATIONS

Mattson, R. L., Gecsei, J., Stutz, D. R., Traiger, I. L., "Evaluation techniques for storage hierarchies", IBM Systems Journal 9(2):78-117 1970.

* cited by examiner

*Primary Examiner* — Zhuo Li
(74) *Attorney, Agent, or Firm* — Vista IP Law Group, LLP

(57) ABSTRACT

Disclosed is an improved approach to implement memory-efficient cache size estimations. A HyperLogLog is used to efficiently approximate an MRC with sufficient granularity to size caches.

30 Claims, 28 Drawing Sheets

# METHOD AND SYSTEM FOR IMPLEMENTING CACHE SIZE ESTIMATIONS

CROSS-REFERENCE TO RELATED APPLICATIONS

This present application claims the benefit of U.S. Provisional Application No. 62/171,671 filed Jun. 5, 2015, which is hereby incorporated by reference in its entirety.

FIELD

This disclosure concerns implementing cache size estimations.

BACKGROUND

In computing systems, a cache is a component that stores data so that subsequent requests for that same data can be provided faster. The cache may be implemented using any type of storage component, including for example, memory components for memory caches and disk components for disk caches.

A "cache hit" occurs when the requested data can be found in a cache. This means that the requested data can be directly served from cache rather than requiring the expense of having the requested data to be created and/or retrieved from another system. In contrast, a "cache miss" occurs when the requested data cannot be served from the cache. In this situation, additional time and/or expenses (e.g., computational expenses, network expenses, I/O expenses) will need to be incurred to obtain the requested data.

As is evident, it is generally the case that the more that requests can be served from the cache, the faster a given system can perform. The problem is that caches are expensive to implement, and the larger the cache, the more expensive it is to implement that cache. A cache that is sized too large is wasteful, since it will not receive enough benefit from the extra cache portions beyond what it really needs to offset the cost of that excess (and likely underutilized) cache. On the other hand, implementing a cache that is too small will likely result in performance problems due to excessive cache misses.

Miss Rate Curves (MRC) have been generated to attempt to address this problem, by tracking or estimating cache usage to attempt to determine the miss rates for a given cache size. The problem is that conventional MRC algorithms require large amounts of memory to keep track of how the cache is being used. For example, estimating cache hit ratios (the cache hit ratio is one minus the cache miss ratio) given a particular cache size traditionally demands prohibitive memory consumption requirements, which is often linear with the working set size. As the size of the working set grows larger, the amount of memory needed to compute the MRC also grows larger, causing excessive computing inefficiencies and lack of scalability. The computational demands of the conventional approaches increase with the product of working set size and the request rate. There have been improvements to reduce the complexity of the computational demands to logarithmic in I/O rate, but the memory space requirements remain linear with working-set size.

Therefore, there is a need for an improved and more memory-efficient approach to implement cache size estimations.

SUMMARY

Embodiments of the present invention provide an improved approach to implement memory-efficient approach to implement cache size estimations. According to some embodiments, a HyperLogLog is used to efficiently approximate an MRC with sufficient granularity to size caches.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The drawings illustrate the design and utility of embodiments of the present invention, in which similar elements are referred to by common reference numerals. In order to better appreciate the advantages and objects of embodiments of the invention, reference should be made to the accompanying drawings. However, the drawings depict only certain embodiments of the invention, and should not be taken as limiting the scope of the invention.

FIG. 5 shows a flowchart of an approach that can be taken to compute MRC data values.

FIG. 6 illustrates computation of MRC data values with regards to the HLLs that were described in FIGS. 4-1 through 4-15.

FIG. 7 illustrates MRC values graphed relative to their cache size values.

FIG. 8 shows one example storage architecture that can be used in a virtualization system.

FIG. 9 illustrates a self-contained virtualization appliance.

FIG. 10 illustrates an approach for implementing SOCS-based storage management in a virtualization environment according to some embodiments of the invention.

FIG. 11 is a block diagram of a computing system suitable for implementing an embodiment of the present invention.

DETAILED DESCRIPTION OF THE EMBODIMENTS OF THE INVENTION

Embodiments of the present invention provide an improved approach to implement memory-efficient approach to implement cache size estimations. According to some embodiments, a HyperLogLog is used to efficiently approximate an MRC with sufficient granularity to size caches. This permits the invention to implement a low-memory approach for determining the cardinality of a set within some error bounds.

Figure 1A:
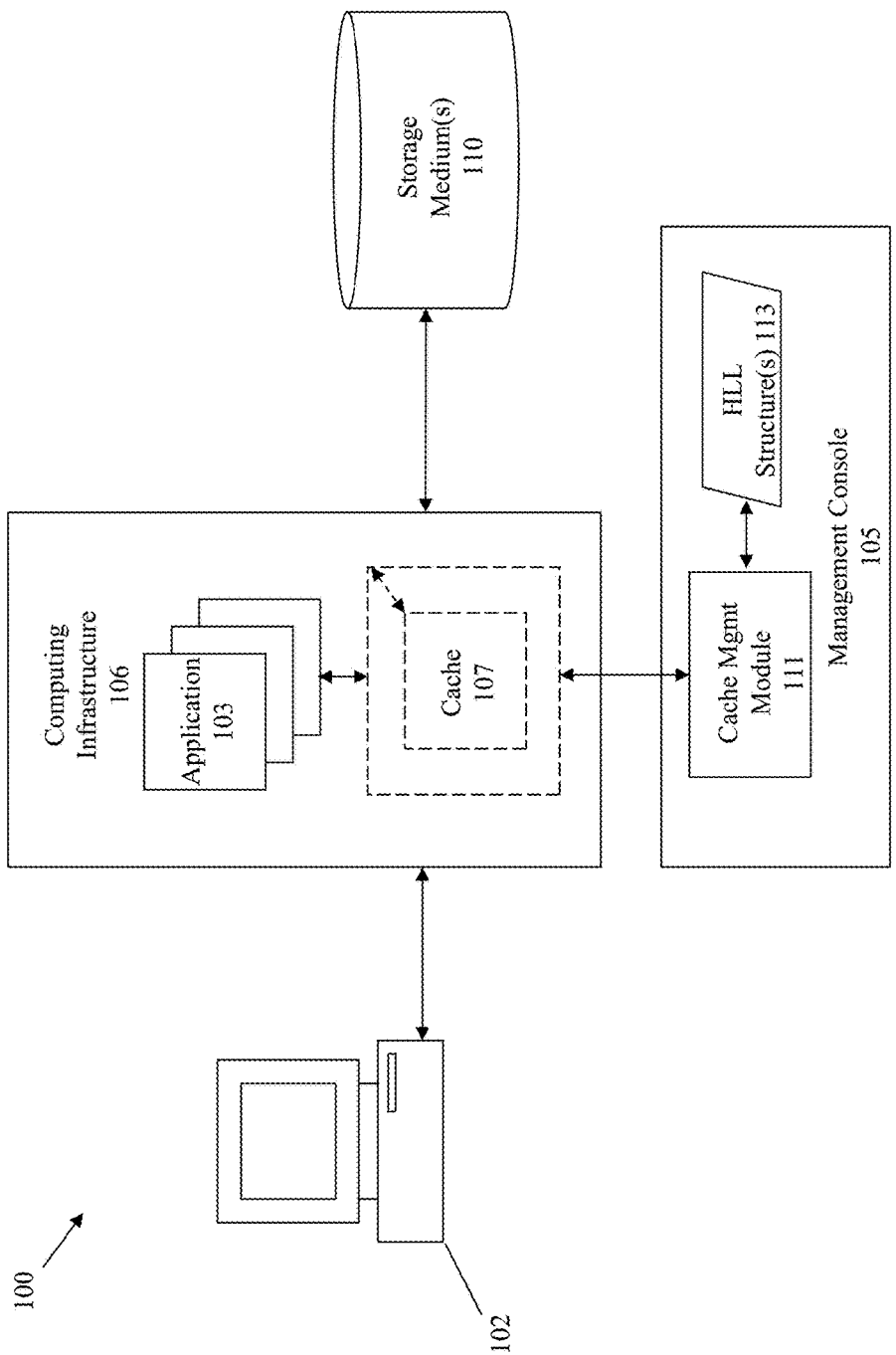
FIG. 1A illustrates a system to implement cache estimation according to some embodiments of the invention.

FIG. 1A illustrates a system 100 to implement cache estimation according to some embodiments of the invention. The system 100 includes one or more users at one or more user stations 102 that use the system 100 to operate the system 100 and/or management console 105. The user station 102 comprises any type of computing station that may be used to operate or interface with the system 100. Examples of such user stations include, for example, workstations, personal computers, or remote computing terminals. The user station 102 comprises a display device, such as a display monitor, for displaying a user interface to users at the user station. The user station 102 also comprises one or more input devices for the user to provide operational control over the activities of the system 100, such as a mouse or keyboard to manipulate a pointing object in a graphical user interface.

System 100 includes a computing infrastructure 106, comprising any processing components necessary to implement a computing environment. Computing infrastructure comprise one or more applications 103 that operates in conjunction with a cache 107. Consider, for example, if the application 103 requests an item of data that is located at a remote storage medium 110. The application 103 will first attempt to retrieve the requested data from the cache 107. If a cache hit occurs, then the requested data can be served to the application 103 from the cache 107. On the other hand, if a cache miss occurs, then the requested data will need to be retrieved from the remote storage medium 110, incurring significantly more time and expense as compared to retrieving the data from the cache 107.

It is very desirable to be able to optimally determine the appropriate size for the cache 107. Having an appropriately sized cache avoids the situation where not enough cache has been allocated, which is likely to cause performance problems due to excessive cache misses. An appropriately sized cache will also avoid the situation where too much cache is allocated, which is also inefficient since the excessive cache may be underutilized and does not provide enough "bang for the buck" relative to the expense of the extra cache portions beyond what is really needed.

A management console 105 is provided having an interface that permits an administrator to manage and administer the cache 107 in the computing infrastructure 106. A cache management module 111 interacts with one or more Hyper-LogLog (HLL) structures 113 to perform cache estimation functionality in the system.

A HLL algorithm/structure uses a fixed amount of memory to represent and count the number of items within a given set. This type of structure provides the ability to identify the cardinality of a set without requiring the expense of a large amount of memory to be consumed. In some embodiments, HLLs are implemented as probabilistic cardinality estimators, which can significantly reduce the amount of memory that is needed to obtain an approximation of the cardinality. This functionality of HLLs is based at least in part on the observation that the cardinality of a multi-set of uniformly-distributed random numbers can be estimated by calculating the maximum number of leading zeros in the binary representation of each number in the set. If the maximum number of leading zeros observed is n, an estimate for the number of distinct elements in the set is $2^n$. In some embodiments of HLLs, a hash function is applied to elements in the original multi-set, to obtain a multi-set of uniformly-distributed random numbers with the same cardinality as the original multi-set, where the cardinality of this randomly-distributed set can then be estimated. To minimize variance, the multi-set can be split into numerous subsets, and by calculating the maximum number of leading zeros in the numbers in each of these subsets, where harmonic calculations are performed to combine these estimates for each subset into an estimate of the cardinality of the whole set.

In operation, the HLL functions by changing its state if presented with a new member of a set. In other words, presentation of a value that has not been previously seen by the HLL will cause that value to be recorded, and thus a change of state occurs in the HLL. In contrast, presentation of a previously seen value will not result in a change of state (since that value has already been recorded by the HLL).

This ability of the HLL to function in this manner provides a very efficient way to represent a cache for cache estimation/simulation purposes. If a new data value is presented to the HLL, this means that the state of the HLL changes to record that value. If the HLL represents a cache, then this change of state essentially means that a "cache miss" occurs, since that value does not yet exist in the HLL "cache" and hence it cannot be served from the simulated HLL cache. On the other hand, if the value already exists in the HLL, then the state of the HLL does not change. If the HLL represents a cache, then this failure to change state means that the HLL cache does indeed already include a copy of the requested data item, and hence a "cache hit" would have occurred.

The HLL is able to perform this type of functionality in a very memory efficient way. Only a very small amount of memory is needed to implement a HLL that can represent an extremely large number of unique values. This permits the inventive approach to use very memory efficient HLL structures that can represent a large number of different cache sizes with great efficiency and effectiveness.

As applied to storage, consider a system that performs size 4 KB reads on a storage unit (e.g., disk) at (block) offsets 10, 20, 30, 20, 30, and 40. The cardinality of this set is 4, and the working set size is 4 KB*4=16 KB. This approach does not care how large the disk is or how many reads is needed from the disk; all that is cared about is how many unique 4 KB blocks were read from disk.

Figure 1B:
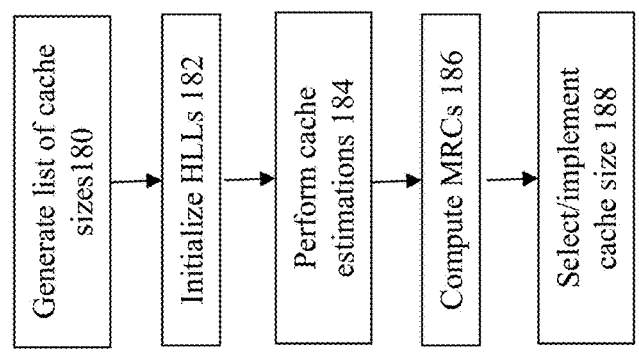
FIG. 1B shows a high-level flowchart of some embodiments of the invention.

FIG. 1B shows a high-level flowchart of some embodiments of the invention. At 180, a set of different cache sizes are selected for analysis. This list of sizes represents the set of cache sizes for which it is desired to identify MRC values, and therefore represents possible expectant cache sizes to implement for the system.

At 182, initialization is performed on the HLLs that will be used to represent the different cache sizes. As described in more detail below, the initialization process sets up the HLL to be used in the cache analysis process.

At 184, cache estimation is performed using the HLLs. In some embodiments, the inventive approach uses a cardinality estimator to simulate a cache of a certain size by resetting the cardinality estimator whenever it reaches the target size. By doing so, one can estimate the miss rate at that particular cache size (assuming counts are performed of hits and misses as described below). Further, one can run many cardinality estimators of different sizes in parallel to allow approximation of the MRC across all of those cache sizes (and the cache sizes in between). This invention uses less memory than other known methods for determining the MRC.

At 186, the MRC values are computed for the different cache sizes. This calculation is performed using the results of the cache estimation process, e.g., based at least in part on the miss counter values and hit counter values that are maintained during the cache estimation process.

Thereafter, at 188, selection can be made of the appropriate cache size for the system. This can be accomplished, for example, by identifying a target and/or threshold MRC value for a given system. The selected cache size would be chosen as the smallest cache size that satisfies the threshold and/or target MRC value.

Figure 2:
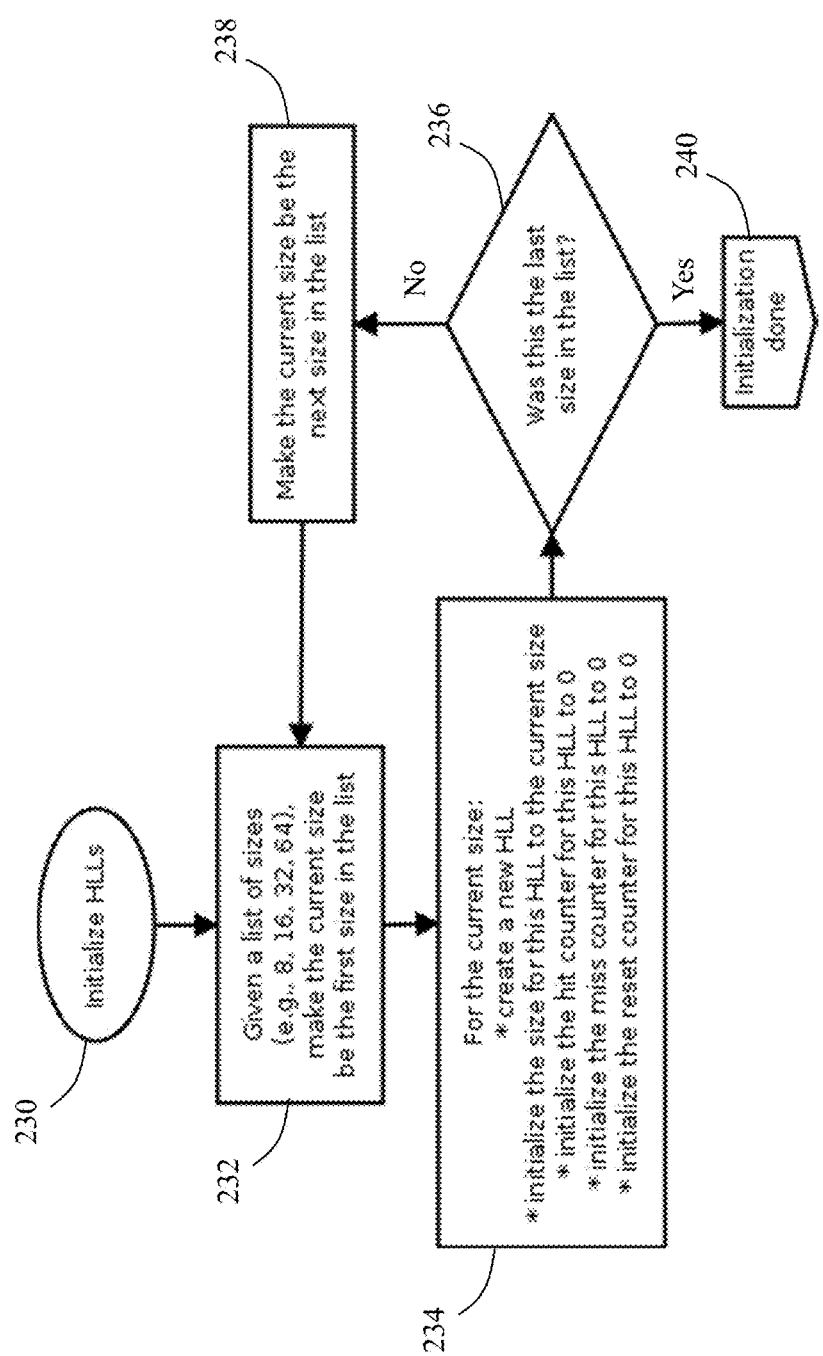
FIG. 2 shows a flowchart of a process to perform initialization and set-up of the HLLs.

FIG. 2 shows a flowchart of a process to perform initialization and set-up of the HLLs. At 230, the process begins the process to initialize the HLLs. Each HLL represents a different cache size for estimation. For example, assuming the desire to analyze four different cache sizes (e.g., for 8, 16, 32, and 64 GByte cache sizes), there would be four HLLs that would be selected. At 232, one of the sizes is identified for processing for a current HLL (e.g., the first size in the list if this is the first time through the processing loop).

At 234, initialization tasks are performed upon the currently selected HLL. One initialization task is to initialize the current HLL for the currently selected size. For the current HLL, several counters are initialized for that HLL. For example, the miss counter and the hit counter are initialized to "0" for the current HLL. In addition, a reset counter is initialized for the HLL. As described in more detail below, the HLL may be reset during the cache estimation process, and the reset counter is used to count the number of times that a rest occurs for the HLL.

At 236, a determination is made whether the current size is the last size in the list. If so, then the initialization process ends at 240. However, if there are additional cache sizes that need to be initialized for the HLLs, then the process proceeds to 238 to make the current size be the next size in the list. The process then loops through the above actions to initialize the HLL for this current size. This continues until all sizes from the list have been initialized.

Figure 3:
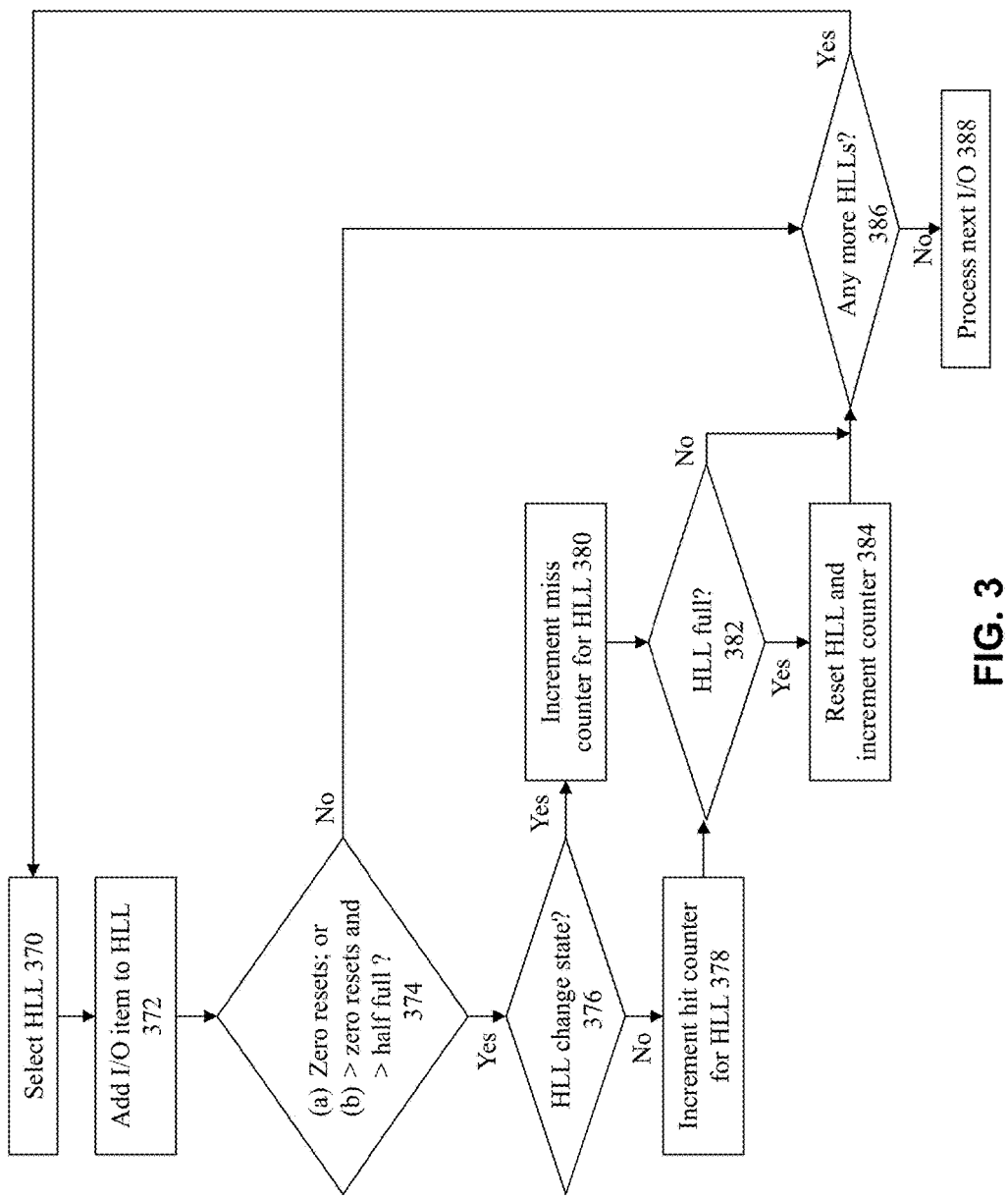
FIG. 3 shows a flowchart of a process to perform cache estimations.

FIG. 3 shows a flowchart of a process to perform cache estimations, where a set of I/Os will be processed by each of the HLLs in the set of HLLs to perform the cache estimations. Therefore, assume that an I/O has been received for processing (e.g., an I/O at a given offset and length has entered the system).

At 370, a HLL from the set of HLLs is selected for processing. For example, assuming that four HLLs have been initialized to represent four different cache sizes (e.g., for 8, 16, 32, and 64 GByte cache sizes), then one of these HLLs is selected at 370 (e.g., the first HLL for the first size in the list if this is the first time through the processing loop). At 372, the data item for the I/O is added to the HLL.

A determination is made at 374 whether cache hit/miss processing should be performed, or whether the processing should just skip to the next HLL at this point. For example, analysis can be made upon the "reset" status of the HLL to determine whether processing should skip to the next HLL.

In some embodiments, resets may be performed upon a given HLL if that HLL is considered "full". The reason this action is performed in some embodiments is because otherwise (without resets), the HLL may effectively become a limitless cache, which would defeat the ability of the HLL to properly simulate the selected size for the HLL. Therefore, if the HLL has had zero previous resets, then the processing will continue onward through the process to perform cache hit/miss processing.

On the other hand, if there has previously been a reset, then additional considerations may be performed to check whether cache hit/miss processing will be performed at this time, or whether that processing will be skipped. The reason for this type of checking is because real caches do not tend to "reset" themselves when they become full. As a result, immediately counting cache misses after a reset may tend to overestimate the amount of cache misses that occur for a given cache size. To offset this effect, some period of time may be established before cache hits/misses are counted. In some embodiments, if there has been a previous reset, this determination is made by checking whether the current HLL is more than half full. If the HLL is more than half full (and a previous reset was performed), then the miss/hit counters are incremented. On the other hand, if the HLL is not more than half full (and a previous reset was performed), then the process does not take the path to increment the hit/miss counters.

Assuming that a determination is made at 374 to continue with hit/miss processing, then the process proceeds to 376 to determine whether the HLL had changed state. If a new data value is presented to the HLL, this means that the state of the HLL changes to record that value. If the HLL represents a cache, then this change of state essentially means that a "cache miss" occurs, since that value does not yet exist in the HLL "cache" and hence it cannot be served from the simulated HLL cache. Therefore, if the state of the HLL did change, then the miss counter is incremented at 380. On the other hand, if the value already exists in the HLL, then the state of the HLL does not change. If the HLL represents a cache, then this failure to change state means that the HLL cache does indeed already include a copy of the requested data item, and hence a "cache hit" would have occurred. Therefore, if the state of the HLL did not change, then the hit counter is incremented at 378.

A determination is then made at 382 whether the HLL is now full. If so, then the HLL is reset at 384. The reset counter for the HLL is also incremented at this point.

A determination is made at 386 whether there are any additional HLLs left to process. If so, then the process loops back to 370 to select another HLL and to perform the above processing on the newly selected HLL. If there are no other HLLs to process, then the next I/O is selected for processing at 388.

Figures 1, 4:
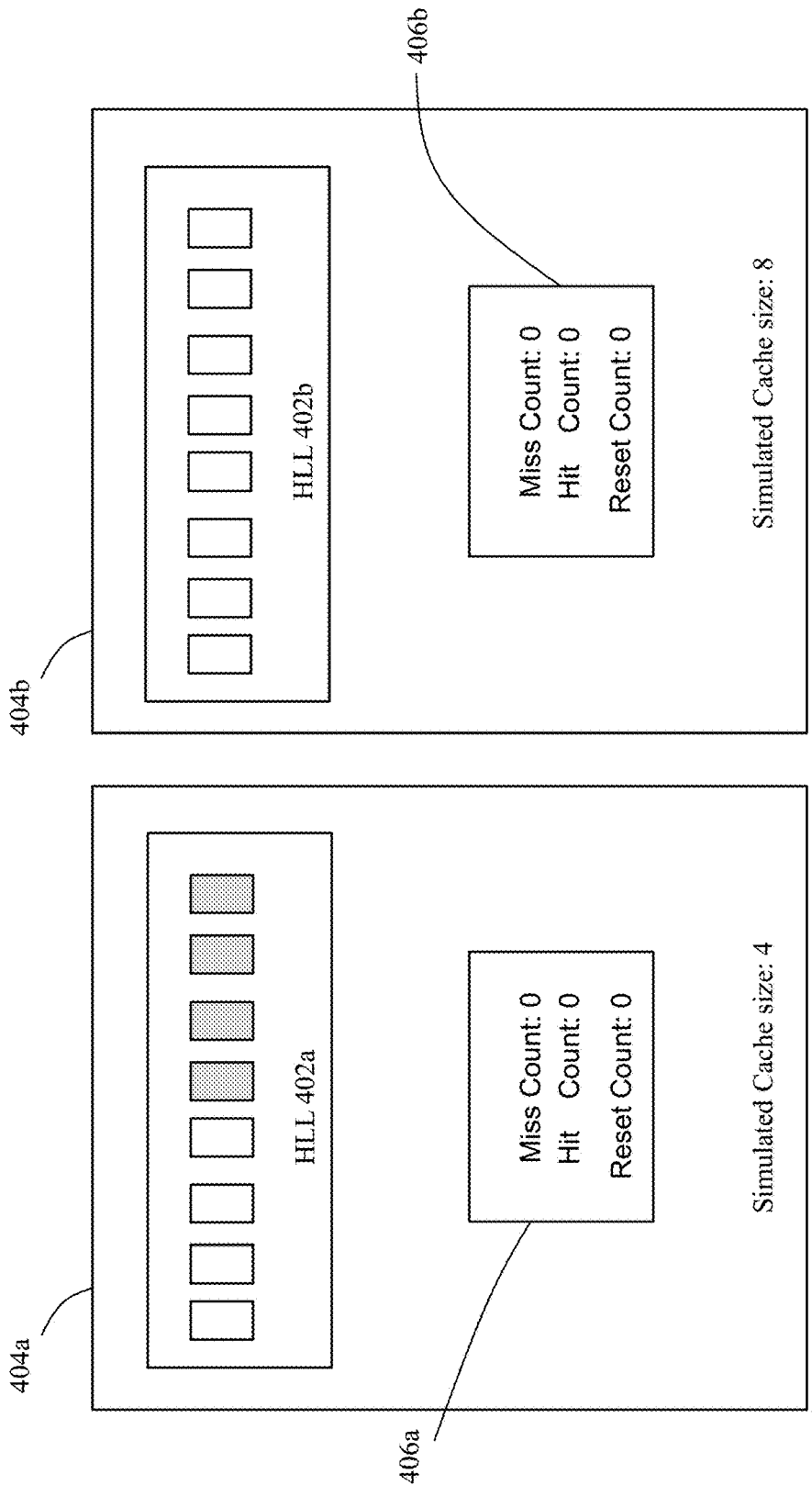
FIGS. 4-1 through 4-15 provide an illustrative example of the cache estimation process.
Figures 2, 4:
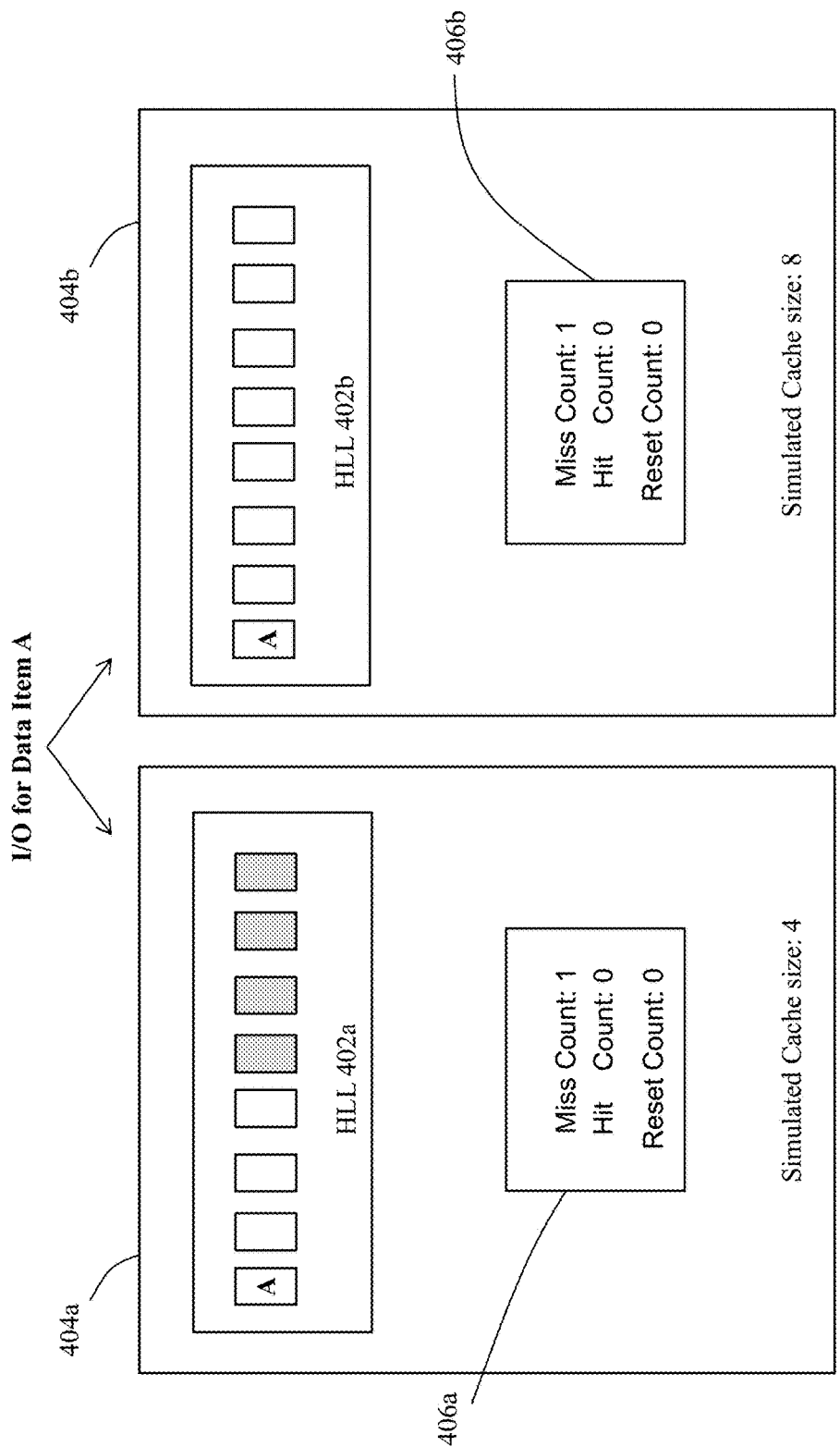
Figures 3, 4:
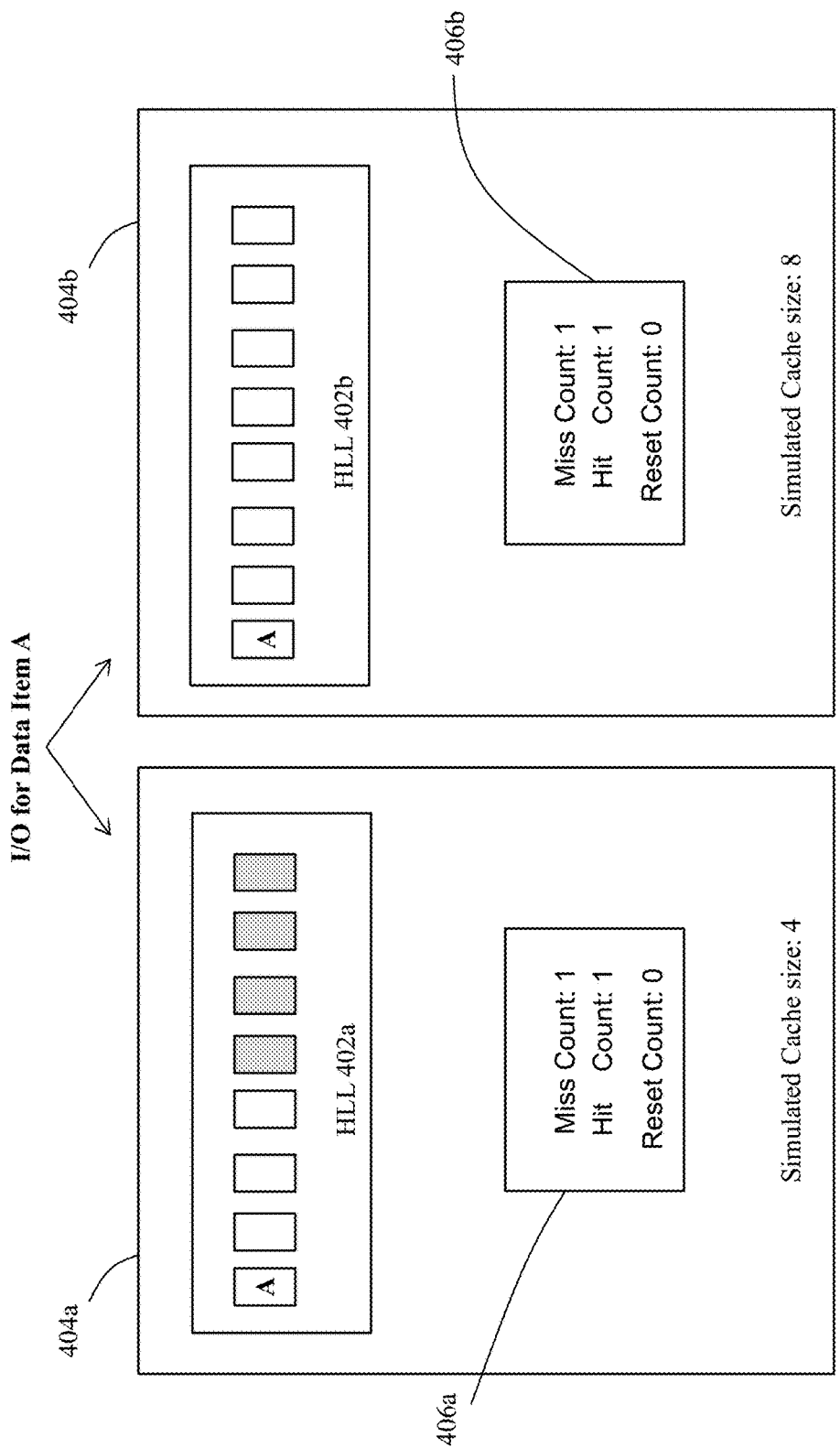
Figure 4:
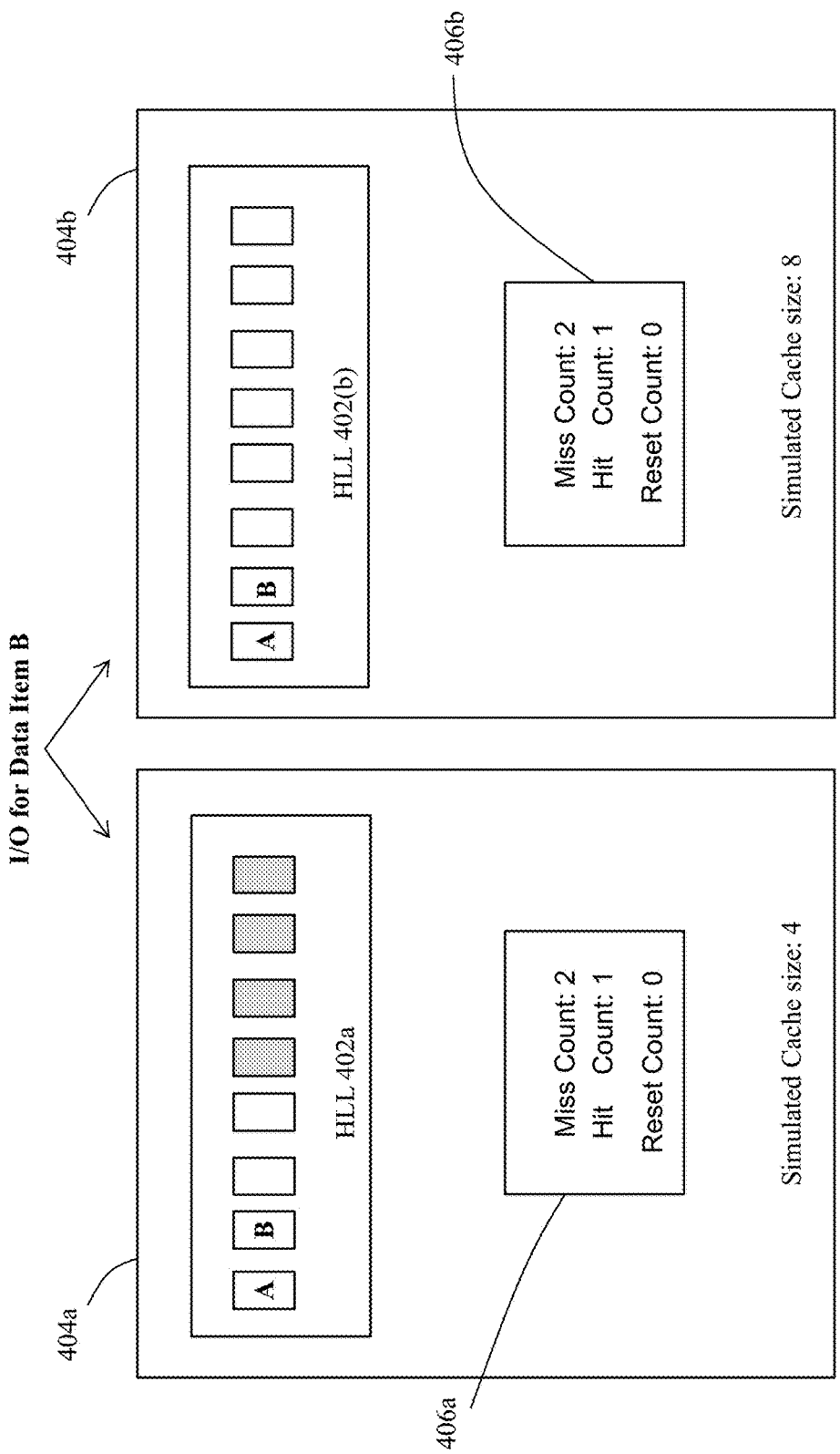

FIGS. 4-1 through 4-15 provide an illustrative example of this process. FIG. 4-1 shows two simulated caches 404*a* and 404*b*, where simulated cache 404*a* is represented using HLL 402*a* and simulated cache 404*b* is represented using HLL 402*b*. Each HLL is associated with data structures that represent various counters for the HLL. For example, counters 406*a* and 406*b* are implemented to count hits, misses, and HLL resets.

The simulated caches are configured such that each corresponds to a different cache size. For example, simulated cache 404*a* is configured to represent a cache size "4" whereas simulated cache 404*b* is configured to represent a cache sized of "8".

In the current embodiment, a fixed amount of memory is used to implement the HLL regardless of whether it represents a cache having any particular size. Therefore, each of the HLLs 402*a* and 402*b* are pictorially shown with the same number of boxes (eight) inside the HLL, where a unique data item may be placed into each box—even though one of the HLLs (HLL 402*a*) corresponds to a size "4" and the other HLL (HLL 402*b*) corresponds to a different size of "8". For HLL 402*a* which corresponds to a size of "4", this means that only four of the eight boxes in the HLL will be used to represent the state of unique data items. However, for HLL 402*b*, since this HLL corresponds to a size of "8", all eight of the boxes can be used to represent the eight unique data items in the HLL. By using the same amount of memory for each HLL, this ensures that the amount of space required is linear in the number of points along the X-axis of the MRC, but is constant in the working set size, the number and size of I/O operations, and the rate of those I/O operations. The constant size is obtained as a property of the statistical nature of HLL, and the novel use of HLL as a cache simulator.

It is noted that in alternate embodiments, different HLL memory sizes may be implemented as appropriate.

These numerical sizes of "4" and "8" may represent any desired units appropriate for caches, e.g., 4 and 8 Mbytes, 4 and 8 GBytes, etc. In addition, it is noted that while this example only shows simulated caches of two sizes, actual usage of this embodiment of the invention may correspond to any number of HLLs used to represent a much larger number of cache sizes.

For purposes only of easily explaining the present embodiment, it is assumed that each data item corresponds to a data size of "1" unit, such that any I/O for a data item will completely fill up a box within the illustrated HLL. It is noted, however, that the invention is not limited to this approach, and that I/O may occur at any level of granularity—and not just a one-to-one alignment with the units in the HLL. Therefore, the following description of the data I/O, their unit sizes, and their alignment with boxes in the HLLs is merely illustrative, and not limiting as the actual implementation of embodiments of the invention.

At the point shown in FIG. 4-1, the HLLs are in their just-initialized state. This means that no I/Os have yet been processed by the HLLs, and that all of the counters are currently set to zero.

FIG. 4-2 illustrates the situation when a first I/O is received by the simulated caches 404a and 404b. The newly received I/O is with regards to a data item A. Since data item A has not yet been seen by the HLLs, each of the HLLs will change state to include a representation of that data item. In this case, the first box in both HLL 402a and 402b will be changed to indicate the changes of state with regards to data item A. In addition, since a change of state occurred for each HLL and the reset count is still zero for both HLLs, the miss counter for each HLL is incremented at this point (from 0→1). This figure essentially illustrates the situation when a cache miss occurs, and the data item is therefore stored in cache for future access.

FIG. 4-3 illustrates the situation when another I/O is received by the simulated caches 404a and 404b pertaining to the same data item A. Since data item A has already been seen by the HLLs, each of the HLLs will not change state to include a new representation of that data item. Since a change of state did not occur for the HLLs, the hit counter for each HLL is incremented at this point (from 0→1). This figure essentially illustrates the situation when a cache hit occurs, and therefore the data item can be served from cache rather than created and/or retrieved from back-end storage.

FIG. 4-4 illustrates the situation when an I/O is received by the simulated caches 404a and 404b for data item B. Since data item B has not yet been seen by the HLLs, each of the HLLs will change state to include a representation of that data item. In this case, the second box in both HLL 402a and 402b are changed to indicate the changes of state with regards to data item B. In addition, since a change of state occurred for each HLL and the reset count is still zero for both HLLs, the miss counter for each HLL is incremented at this point (from 1→2). As before, this figure illustrates the situation when a cache miss occurs for data item B, and the data item B is therefore stored in cache for future access.

Figures 4, 5:
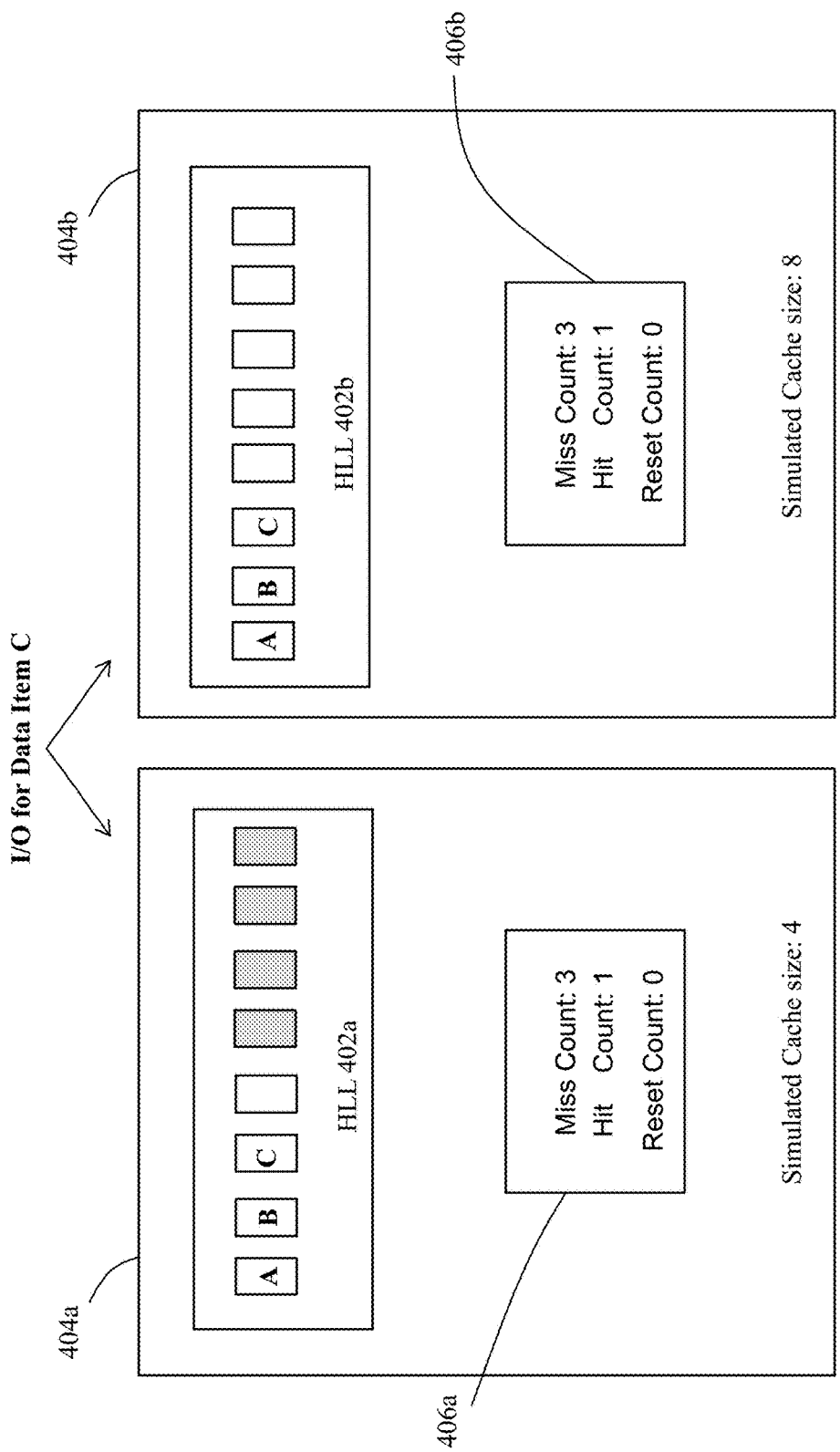

FIG. 4-5 illustrates the situation when an I/O is received by the simulated caches 404a and 404b for data item C. Since data item C has not yet been seen by the HLLs, each of the HLLs will change state to include a representation of that data item. In this case, the third box in both HLL 402a and 402b are changed to indicate the changes of state with regards to data item C. In addition, since a change of state occurred for each HLL, the miss counter for each HLL is incremented at this point (from 2→3).

Figures 4, 5, 6:
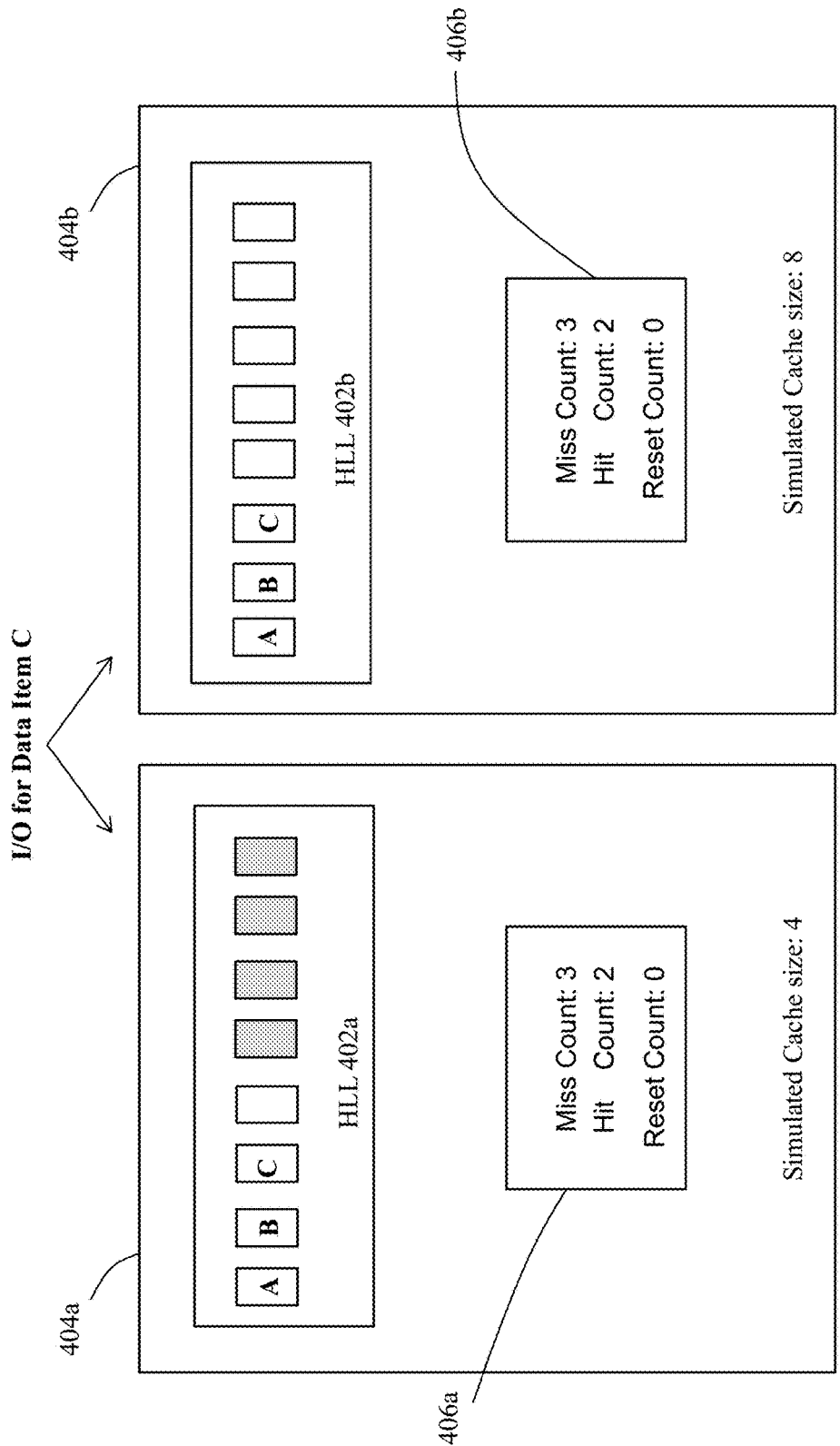

FIG. 4-6 illustrates the situation when another I/O is received by the simulated caches 404a and 404b pertaining to the same data item C. Since data item C has already been seen by the HLLs, the HLLs will not change state to include a new representation of that data item C. Since a change of state did not occur for the HLLs, the hit counter for each HLL is incremented at this point (from 1→2).

FIG. 4-7 illustrates the situation when an I/O is received by the simulated caches 404a and 404b for new data item D. Since data item D has not yet been seen by the HLLs, each of the HLLs will change state to include a representation of that data item. In this case, the fourth box in both HLL 402a and 402b are changed to indicate the changes of state with regards to data item D. In addition, since a change of state occurred for each HLL, the miss counter for each HLL is incremented at this point (from 3→4).

At this point, HLL 402a is now full. This can be visually seen in the figure, since all four boxes in HLL 402a now includes a data item value. As a result, a reset is performed for this HLL. As shown in FIG. 4-8, this means that the previous data item values are cleared from the HLL 402a. In addition, the reset counter for this HLL 402a is incremented (from 0→1).

FIG. 4-9 illustrates the situation when an I/O is received by the simulated caches 404a and 404b for data item D.

Here, data item D had previously been seen by both HLLs 402a and 402b. However, due to the reset of HLL 402a, this means that HLL 402a will essentially represent the situation where data item D has already been removed and/or aged out of simulated cache 404a. As a result, since data item D is not already represented by HLL 402a, this means that HLL 402a will now change state to include a representation of data item D. In this case, the first box in HLL 402a is changed to indicate the change of state with regards to data item D.

Normally, a change of state will cause the miss counter for a HLL to be incremented. However, in the current situation, since the HLL is not yet more than half full and because the reset count for 402a is now >0, the miss counter will not be incremented.

Regarding HLL 402b, the data item D had previously been seen by the HLL and since a reset did not occur for this HLL, this data item D is still represented by the fourth box in the HLL. Therefore, HLL 402b has not changed state to include a new representation of that data item D. Since a change of state did not occur for HLL 402b, the hit counter for the HLL is incremented at this point (from 2→3).

FIG. 4-10 illustrates the situation when another I/O is received by the simulated caches 404a and 404b pertaining to the same data item D. Since data item D has already been seen by the HLLs, the HLLs will not change state to include a new representation of that data item D. Since a change of state did not occur for HLL 402b, the hit counter for this HLL is incremented at this point (from 3→4). However, since the HLL 402a had undergone a reset and is still not more than half full, the hit counter for HLL 402a is not incremented at this point.

FIG. 4-11 illustrates the situation when an I/O is received by the simulated caches 404a and 404b for new data item E. Since data item E has not yet been seen by the HLLs, each of the HLLs will change state to include a representation of that data item. In this case, the second box in HLL 402a and the fifth box in HLL 402b are changed to indicate the changes of state with regards to data item E. In addition, since a change of state occurred for HLL 402*b*, the miss counter for this HLL is incremented at this point (from 4→5). However, since the HLL 402*a* had undergone a reset and is still not more than half full, the miss counter for HLL 402*a* is not incremented at this point.

FIG. 4-12 illustrates the situation when an I/O is received by the simulated caches 404*a* and 404*b* for data item A.

Here, data item A had previously been seen by both HLLs 402*a* and 402*b*. However, due to the reset of HLL 402*a*, HLL 402*a* represents the situation where data item A has already been removed and/or aged out of simulated cache 404*a*. As a result, since data item A is not already represented by HLL 402*a*, this means that HLL 402*a* will now change state to include a representation of data item A. In this case, the third box in HLL 402*a* is changed to indicate the change of state with regards to data item A.

Here, since the HLL 402*a* is now more than half full, this means that even though a previous reset did occur for HLL 402*a*, processing will proceed with respect to the hit/miss counter for this HLL. Since a change of state occurred for HLL 402*a*, the miss counter for this HLL is incremented at this point (from 4→5).

Regarding HLL 402*b*, the data item A had previously been seen by the HLL and since a reset did not occur for this HLL, this data item A is still represented by the first box in the HLL. Therefore, HLL 402*b* has not changed state to include a new representation of that data item A. Since a change of state did not occur for HLL 402*b*, the hit counter for the HLL is incremented at this point (from 4→5).

FIG. 4-13 illustrates the situation when another I/O is received by the simulated caches 404*a* and 404*b* pertaining to the same data item A. Since data item A has already been seen by the HLLs, the HLLs will not change state to include a new representation of that data item A. Since a change of state did not occur for HLL 402*b*, the hit counter for this HLL is incremented at this point (from 5→6). In addition, since the HLL 402*a* is now more than half full, this means that even though a previous reset occurred for HLL 402*a*, processing will proceed with respect to the hit/miss counter for this HLL. Since a change of state did not occur for HLL 402*a*, the hit counter for this HLL is incremented at this point (from 2→3).

FIG. 4-14 illustrates the situation when an I/O is received by the simulated caches 404*a* and 404*b* for data item B.

Here, data item B had previously been seen by both HLLs 402*a* and 402*b*. However, due to the reset of HLL 402*a*, HLL 402*a* represents the situation where that data item B is no longer in cache. As a result, since data item B is not already represented by HLL 402*a*, this means that HLL 402*a* will now change state to include a representation of data item B. In this case, the fourth box in HLL 402*a* is changed to indicate the change of state with regards to data item B.

Here, since the HLL 402*a* is now more than half full, this means that even though a previous reset did occur for HLL 402*a*, processing will proceed with respect to the hit/miss counter for this HLL. Since a change of state occurred for HLL 402*a*, the miss counter for this HLL is incremented at this point (from 5→6).

Regarding HLL 402*b*, the data item B had previously been seen by the HLL and since a reset did not occur for this HLL, this data item B is still represented by the second box in the HLL. Therefore, HLL 402*b* has not changed state to include a new representation of that data item B. Since a change of state did not occur for HLL 402*b*, the hit counter for the HLL is incremented at this point (from 6→7).

At this point, HLL 402*a* is now full again. This can be visually seen in the figure, since all four boxes in HLL 402*a* now includes a data item value. As a result, a reset is performed for this HLL. As shown in FIG. 4-15, this means that the previous data item values are cleared from the HLL 402*a*. In addition, the reset counter for this HLL 402*a* is incremented (from 1→2).

If the cache simulation ends at this point, the values maintained in the various hit counters and miss counters can be used to determine the MRC values for each cache size.

FIG. 5 shows a flowchart of an approach that can be taken to compute the MRC 502 data values. At 504, the existing MRC data (for any previous iterations) is reset. At 506, the current HLL is identified for processing (e.g., make the first HLL the current HLL if this is the first time through the processing loop).

At 508, the value of the miss counter is divided by the sum of the miss and hit counter values for the HLL. The result of the division corresponds to the MRC value for the HLL. At 510, the MRC data is recorded for the size of the HLL.

A determination is made at 514 whether there are any additional HLLs to process. If so, then the next HLL is selected at 512, and the processing loops back to perform the above-described processing actions for the newly current HLL. This proceeds until all of the HLLs have been processed. At this point, at 516, the MRC data is returned along with size data for each HLL.

FIG. 6 illustrates this process with regards to the HLLs that were described in FIGS. 4-1 through 4-15. Here, for the HLL 402*a* corresponding to a cache size of "4", the miss counter has a value of 5 and the hit counter has a value of 3. Therefore, the MRC for this HLL for size 4 is miss counter value/(sum of miss counter value plus hit counter value)—which is 5/(5+3) which equals to a 62.5% miss rate.

For the HLL 402*b* corresponding to a cache size of "8", the miss counter has a value of 5 and the hit counter has a value of 7. Therefore, the MRC for this HLL for size 8 is the same equation of the miss counter value/(sum of miss counter value plus hit counter value)—which is 5/(5+7) which equals to a 41.6% miss rate.

Figures 4, 5, 6, 7:
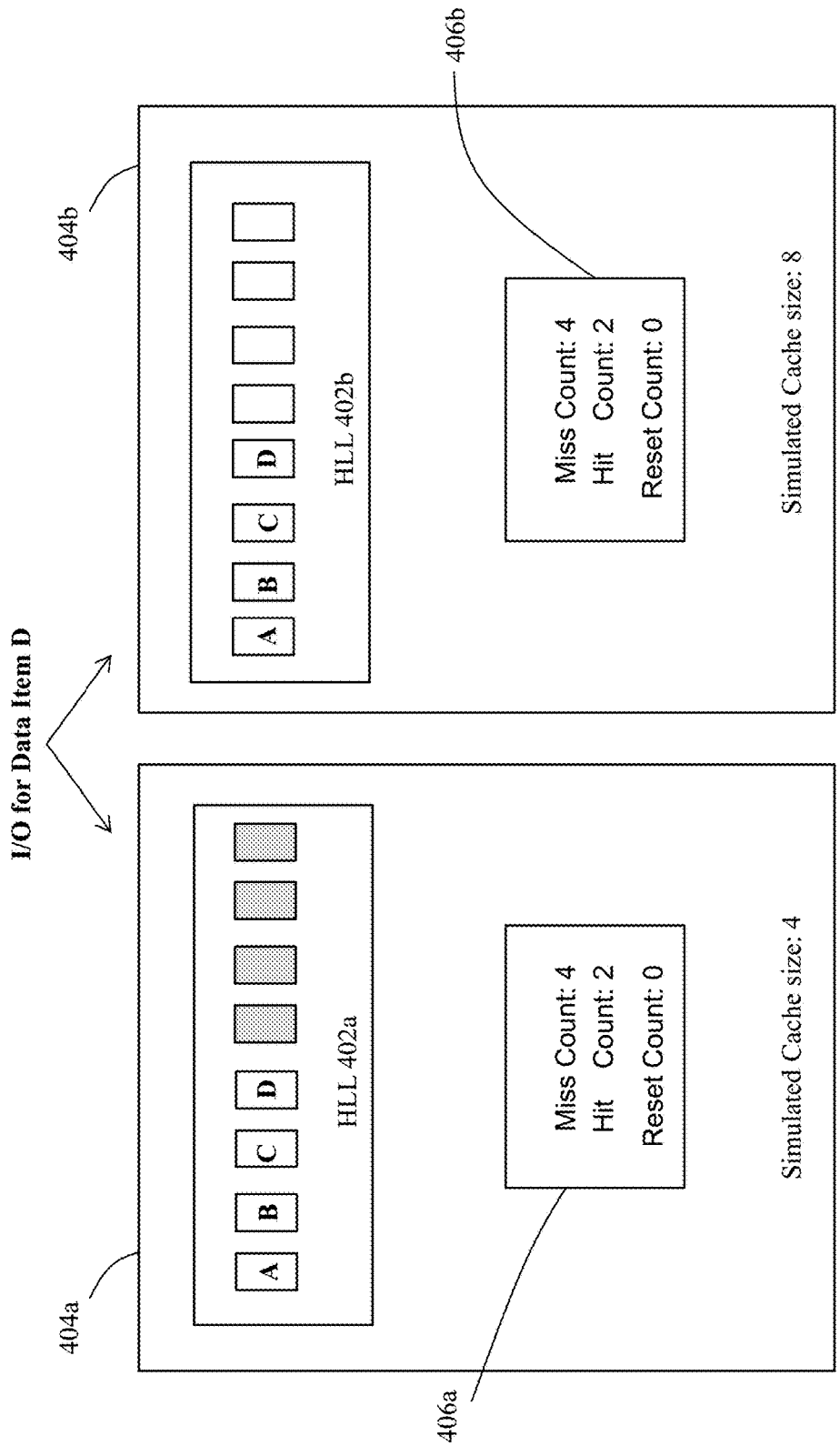

The MRC values can be organized and analyzed in any suitable way. For example, as illustrated in FIG. 7, the MRC values can be graphed to their cache size values. This helps to identify the relative costs and benefits of the different cache sizes, particularly as they pertain to the miss rates. A specific cache value can then be selected to optimize the size of the cache relative to a desired miss rate level. In the example of FIG. 7, one might wish to choose 32 as the cache size that is large enough to provide significant performance benefits, without requiring excessive allocation of cache storage.

Therefore, what has been described is an improved approach to perform cache estimations in a very memory efficient manner. While previous approaches focused on modeling the behavior of an LRU cache, the present embodiments discard this type of model and instead tracks changes in a working set size. This eliminates much of the overhead inherent in prior approaches, especially since a very memory efficient structure (HLL) is employed to track the changes in the working set. From this, one can derive cache behavior, and leverage the results in highly space-efficient cardinality estimators. The memory requirements of this approach are independent of the working set sizes, while still providing high levels of accuracy as compared to the exact LRU-based stack approach.

From a product standpoint, because of the small memory footprint, the inventive approach will be able to provide information about workloads that other approaches cannot provide. Further, the approach can be used to automatically adjust cache sizes, and to provide optimal cache sizing for the best possible performance.

The inventive concepts disclosed herein may be applied to any context in which a cache is used. For example, disk caches are often used to cache data in faster and/or more localized storage as compared to more remote and/or slower back-end storage. As another example, network devices often employ caches to avoid network roundtrips to retrieve data from remote storage locations. In both of these cases, the invention can be applied to estimate and optically size the cache. Other non-limiting examples of caches that can be used in conjunction with the invention include CPU (central processing unit) caches, GPU (graphics processing unit) caches, TLBs (translation lookaside buffers), and web caches.

As an illustrative example, the inventive concepts disclosed herein as particularly applicable to analysis and estimation of caches used in the virtualization context. A "virtual machine" or a "VM" refers to a specific software-based implementation of a machine in a virtualization environment, in which the hardware resources of a real computer (e.g., CPU, memory, etc.) are virtualized or transformed into the underlying support for the fully functional virtual machine that can run its own operating system and applications on the underlying physical resources just like a real computer. Virtualization works by inserting a thin layer of software directly on the computer hardware or on a host operating system. This layer of software contains a virtual machine monitor or "hypervisor" that allocates hardware resources dynamically and transparently. Multiple operating systems run concurrently on a single physical computer and share hardware resources with each other. By encapsulating an entire machine, including CPU, memory, operating system, and network devices, a virtual machine is completely compatible with most standard operating systems, applications, and device drivers. Most modern implementations allow several operating systems and applications to safely run at the same time on a single computer, with each having access to the resources it needs when it needs them. One of ordinary skill in the art appreciates containers (e.g., Linux containers, Dockerized applications) are another type of software-based implementation of a machine in a virtualization environment that can also benefit from the inventive concepts disclosed herein. Containers are further disclosed below in FIG. 12B.

Virtualization allows multiple virtual machines to run on a single physical machine, with each virtual machine sharing the resources of that one physical computer across multiple environments. Different virtual machines can run different operating systems and multiple applications on the same physical computer.

One reason for the broad adoption of virtualization in modern business and computing environments is because of the resource utilization advantages provided by virtual machines. Without virtualization, if a physical machine is limited to a single dedicated operating system, then during periods of inactivity by the dedicated operating system the physical machine is not utilized to perform useful work. This is wasteful and inefficient if there are users on other physical machines which are currently waiting for computing resources. To address this problem, virtualization allows multiple VMs to share the underlying physical resources so that during periods of inactivity by one VM, other VMs can take advantage of the resource availability to process workloads. This can produce great efficiencies for the utilization of physical devices, and can result in reduced redundancies and better resource cost management.

Virtualization systems have now become a relatively common type of technology used in many company and organizational data centers, with ever increasing and advanced capabilities being provided for users of the system. However, the ability of company administrators to manage these virtualizations systems have thus far not kept up with the rapid advances made to the underlying systems themselves. For example, one area where this issue is particularly noticeable and problematic is with respect to the appropriate configuration of the cache for the underlying systems used to implement virtualization.

Figures 4, 5, 6, 7, 8:
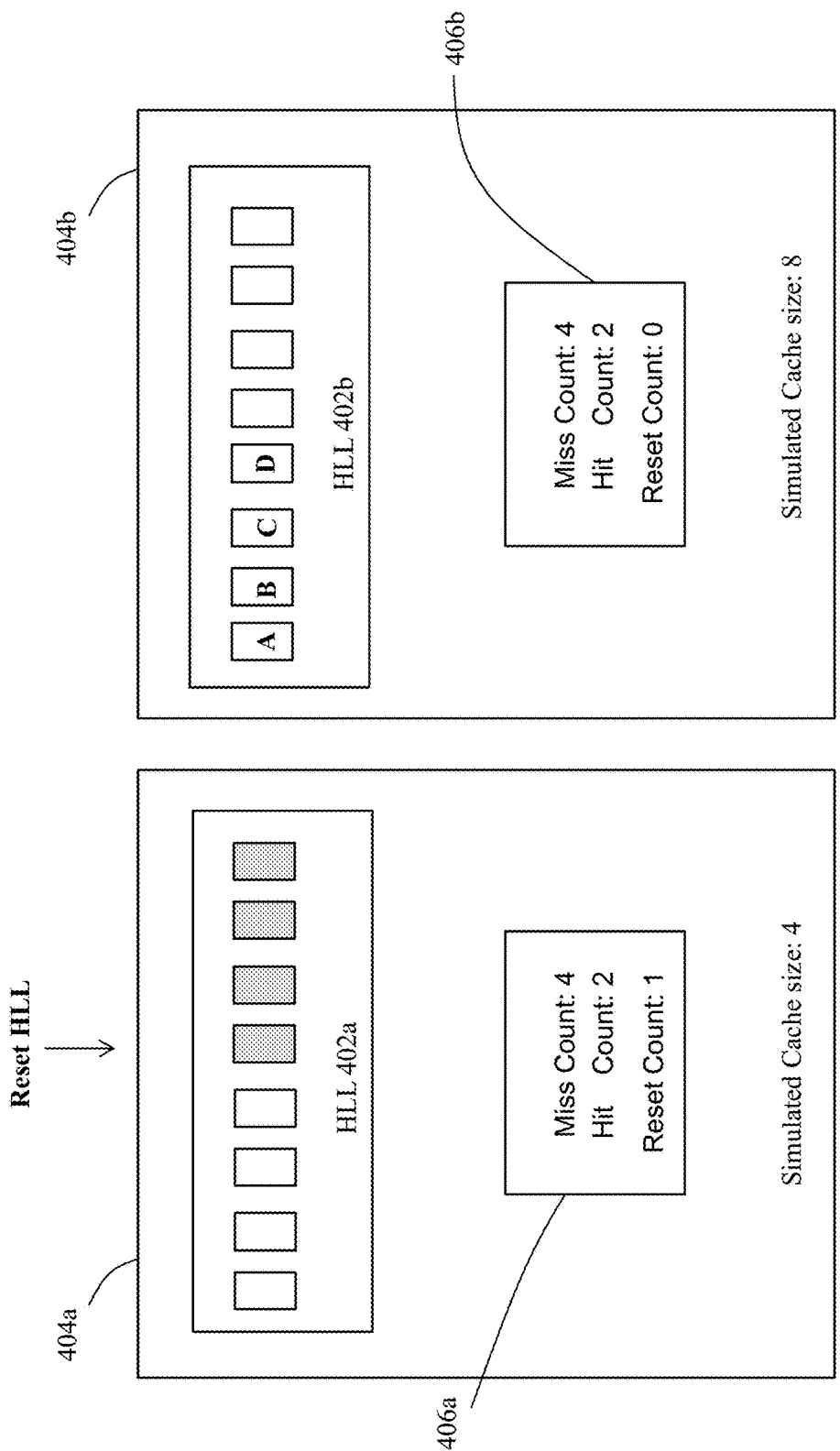

Here, the embodiments of the invention can be applied to optimize caches for any virtualization or storage architecture. FIG. 8 shows one example storage architecture that can be used in a virtualization system having an integrated collection (or "cluster") 800 of virtualization appliances or "blocks" 802*a*, 802*b*, 802*c*, and 802*d*. Each of the blocks are accessible through a network 840. Each of the blocks includes hardware and software to implement a virtualization solution. For example, block 802*b* is internally organized to include hardware and software to implement multiple virtualization nodes. Each node runs a standard hypervisor on hardware that contains processors, memory and local storage, such as a mix of SSDs and/or hard disk drives. Each node runs virtual machines just like a standard virtual machine host.

In addition, local storage from all nodes is virtualized into a unified storage pool, which is referred to herein as "scale-out converged storage" or "SOCS" 855. As described in more detail below, SOCS 855 acts like an advanced SAN that uses local SSDs and disks from all nodes to store virtual machine data. Virtual machines running on the cluster write data to SOCS as if they were writing to a SAN. SOCS is VM-aware and provides advanced data management features. This approach brings the data closer to virtual machines by storing the data locally on the system (if desired), resulting in higher performance at a lower cost. As discussed in more detail below, this solution can horizontally scale from a few nodes to a large number of nodes, enabling organizations to scale their infrastructure as their needs grow.

While traditional SAN solutions typically have 1, 2, 4 or 8 controllers, an n-node system according to the present embodiment has n controllers. Every node in the cluster runs a special virtual machine, called a Controller VM (or "service VM"), which acts as a virtual controller for SOCS. All Controller VMs in the cluster communicate with each other to form a single distributed system. Unlike traditional SAN/NAS solutions that are limited to a small number of fixed controllers, this architecture continues to scale as more nodes are added. In embodiments of the invention, the management console interacts with the controller VMs to configure the SLA policies for storage components.

Figures 4, 5, 6, 7, 8, 9:
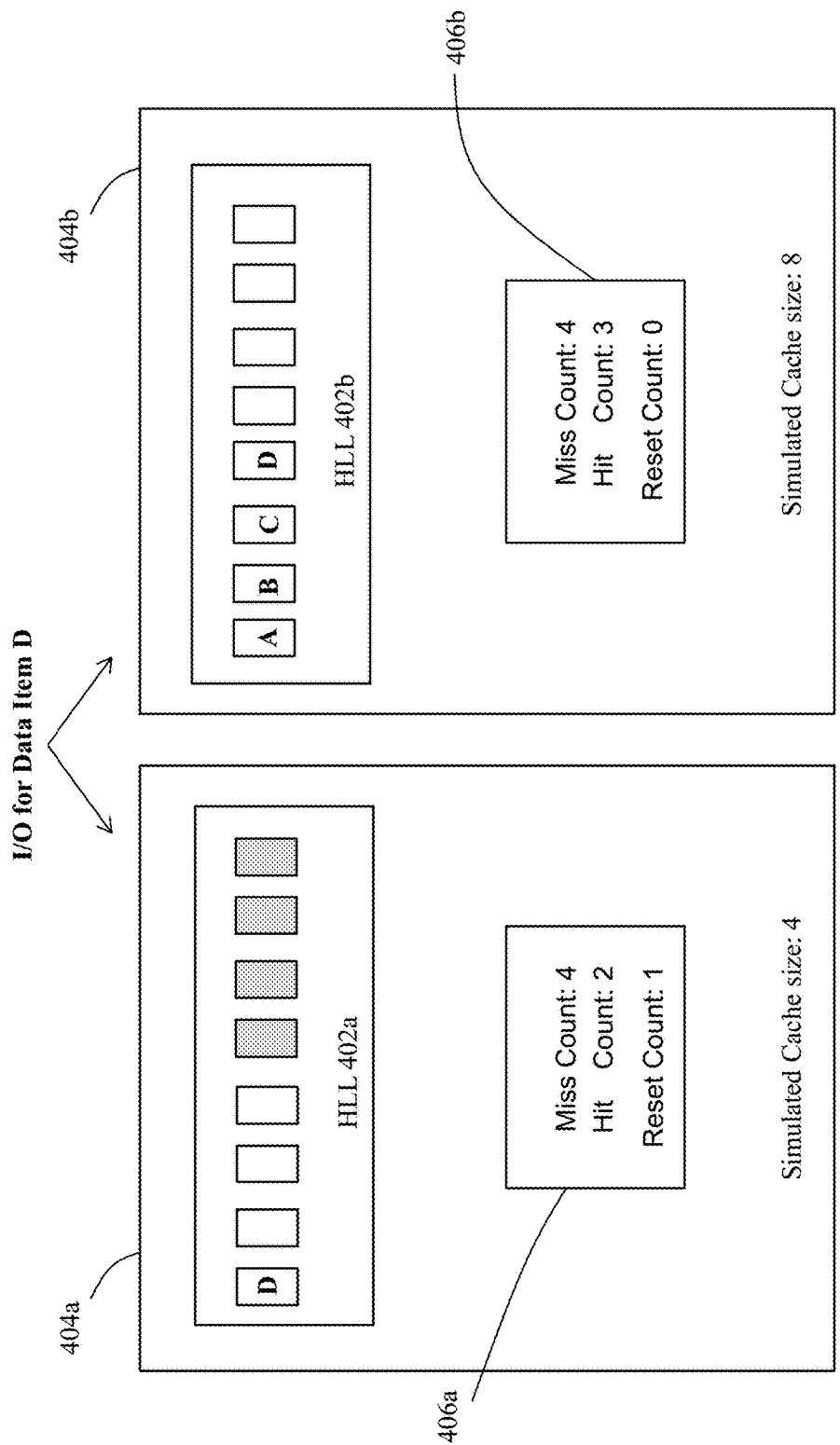

As stated above, each block includes a sufficient collection of hardware and software to provide a self-contained virtualization appliance, e.g., as shown in FIG. 9. The example block 800 in FIG. 8 includes four nodes 1-4. Having the multiple nodes within a block allows both high performance and reliability. Performance is increased since there are multiple independent nodes to handle the virtualization needs of the system. Reliability is improved since the multiple nodes provide for redundancy in the event of a possible hardware or software error. Moreover, as discussed below, the software-based storage management solution allow for easy movement of data as the storage needs of the system changes.

Each node 900 in the block includes both hardware components 902 and software components 904 to implement virtualization. Hardware components 902 includes processing capacity (e.g., using one or more processors) and memory capacity (e.g., random access memory or RAM) on a motherboard 903. The node also comprises local storage 922, which in some embodiments include Solid State Drives (henceforth "SSDs") 925 and/or Hard Disk Drives (henceforth "HDDs" or "spindle drives") 927. Any combination of SSDs and HDDs may be used to implement the local storage 922.

In addition, the hardware components comprise a cache 107 that can be appropriately sized to meet the needs of the software 904 running on the node. The software 904 includes a hypervisor 930 to manage the interactions between the underlying hardware 902 and the one or more user VMs 902a and 902b that run client software. A controller VM 910a exists on each node to implement distributed storage management of the local storage 922, such that the collected local storage for all nodes can be managed as a combined SOCS. One of ordinary skill in the art appreciates while FIG. 9 describes VMs, containers may also be used in place of or in conjunction with the VMs.

Figures 4, 5, 6, 7, 8, 9, 10:
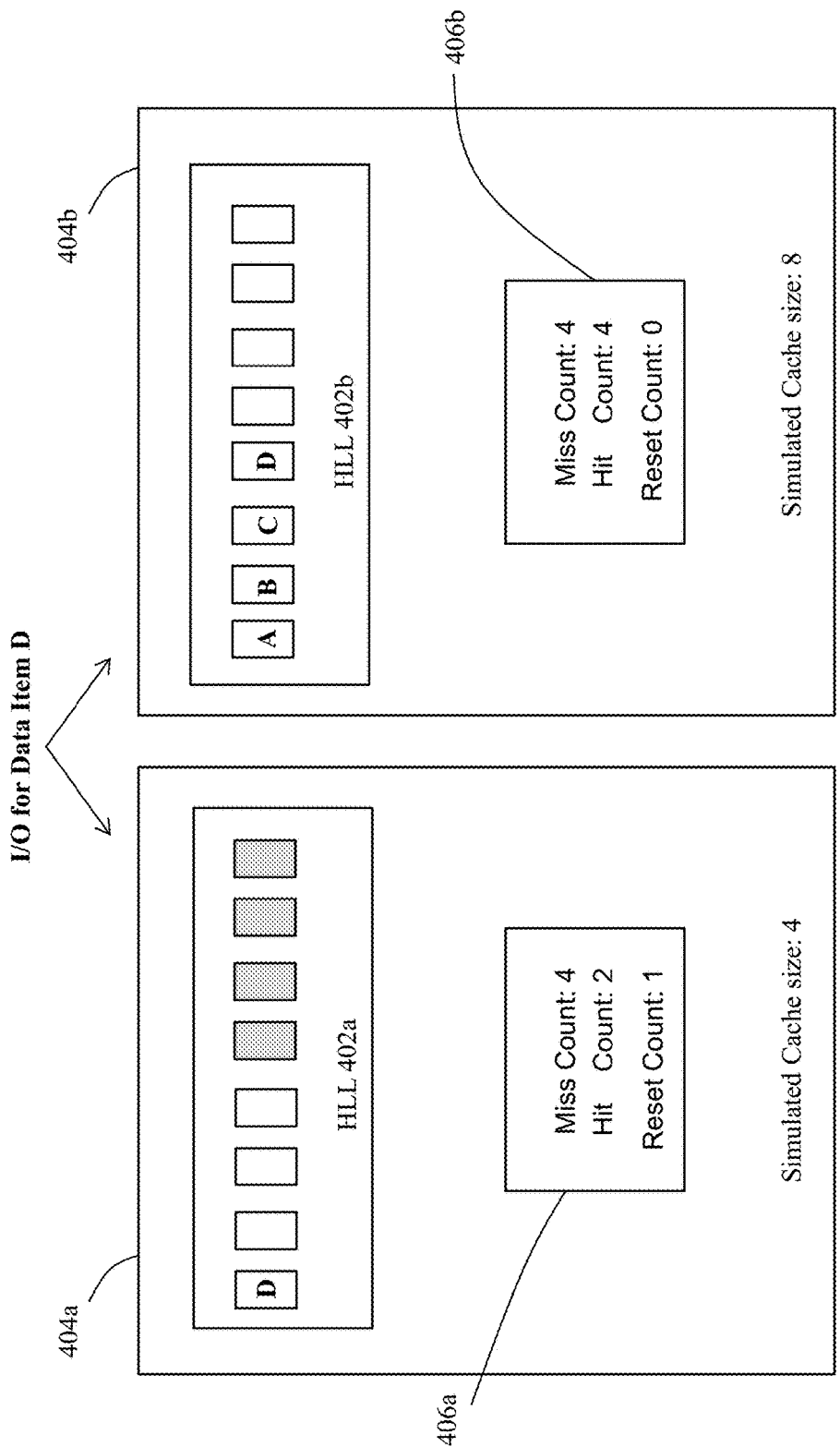

FIG. 10 illustrates an approach for implementing SOCS-based storage management in a virtualization environment according to some embodiments of the invention. The architecture of FIG. 10 can be implemented for a distributed platform that contains multiple nodes/servers 1000a and 1000b that manages multiple-tiers of storage. The nodes 1000a and 1000b may be within the same block, or on different blocks in a clustered environment of multiple blocks. The multiple tiers of storage include storage that is accessible through a network 1040, such as cloud storage 1026 or networked storage 1028 (e.g., a SAN or "storage area network"). In addition, the present embodiment also permits local storage 1022/1024 that is within or directly attached to the server and/or appliance to be managed as part of the storage pool 1060. As noted above, examples of such storage include any combination of SSDs 1025 and/or HDDs 1027. These collected storage devices, both local and networked, form a storage pool 1060.

Each of the nodes 1000a and 1000b include caches, including cache 107a and 107b respectively, that cache data for the nodes. The size of these caches can be estimated and optimized using the techniques described above, by tracking temporal changes in a working set size using HLLs.

Virtual disks (or "vDisks") can be structured from the storage devices in the storage pool 1060, as described in more detail below. As used herein, the term vDisk refers to the storage abstraction that is exposed by a Controller VM to be used by a user VM. In some embodiments, the vDisk is exposed via iSCSI ("internet small computer system interface") or NFS ("network file system") and is mounted as a virtual disk on the user VM. Each server 1000a or 1000b runs virtualization software, such as VMware ESX(i), Microsoft Hyper-V, or RedHat KVM. The virtualization software includes a hypervisor 1030/1032 to manage the interactions between the underlying hardware and the one or more user VMs 1002a, 1002b, 1002c, and 1002d that run client software.

Controller VM 1010a/1010b (also referred to herein as "service VMs") are used to manage storage and I/O activities. This is the distributed "Storage Controller" in the currently described architecture. Multiple such storage controllers coordinate within a cluster to form a single-system. The Controller VMs 1010a/1010b are not formed as part of specific implementations of hypervisors 1030/1032. Instead, the Controller VMs run as virtual machines above hypervisors 1030/1032 on the various nodes/servers 1002a and 1002b, and work together to form a distributed system 1010 that manages all the storage resources, including the locally attached storage 1022/1024, the networked storage 1028, and the cloud storage 1026. Since the Controller VMs run above the hypervisors 1030/1032, this means that the current approach can be used and implemented within any virtual machine architecture, since the Controller VMs of embodiments of the invention can be used in conjunction with any hypervisor from any virtualization vendor.

Each Controller VM 1010a-b exports one or more block devices or NFS server targets that appear as disks to the client VMs 1002a-d. These disks are virtual, since they are implemented by the software running inside the Controller VMs 1010a-b. Thus, to the user VMs 1002a-d, the Controller VMs 1010a-b appear to be exporting a clustered storage appliance that contains some disks. All user data (including the operating system) in the client VMs 1002a-d resides on these virtual disks.

Significant performance advantages can be gained by allowing the virtualization system to access and utilize local (e.g., server-internal) storage 1022 as disclosed herein. This is because I/O performance is typically much faster when performing access to local storage 1022 as compared to performing access to networked storage 1028 across a network 1040. This faster performance for locally attached storage 1022 can be increased even further by using certain types of optimized local storage devices, such as SSDs 1025. Once the virtualization system is capable of managing and accessing locally attached storage, as is the case with the present embodiment, various optimizations can then be implemented to improve system performance even further. For example, the data to be stored in the various storage devices can be analyzed and categorized to determine which specific device should optimally be used to store the items of data. Data that needs to be accessed much faster or more frequently can be identified for storage in the locally attached storage 1022. On the other hand, data that does not require fast access or which is accessed infrequently can be stored in the networked storage devices 1028 or in cloud storage 1026. In addition, the performance of the local storage can be further improved by changing the mix of SSDs and HDDs within the local storage, e.g., by increasing or decreasing the proportion of SSDs to HDDs in the local storage.

Figures 4, 5, 6, 7, 8, 9, 10, 11:
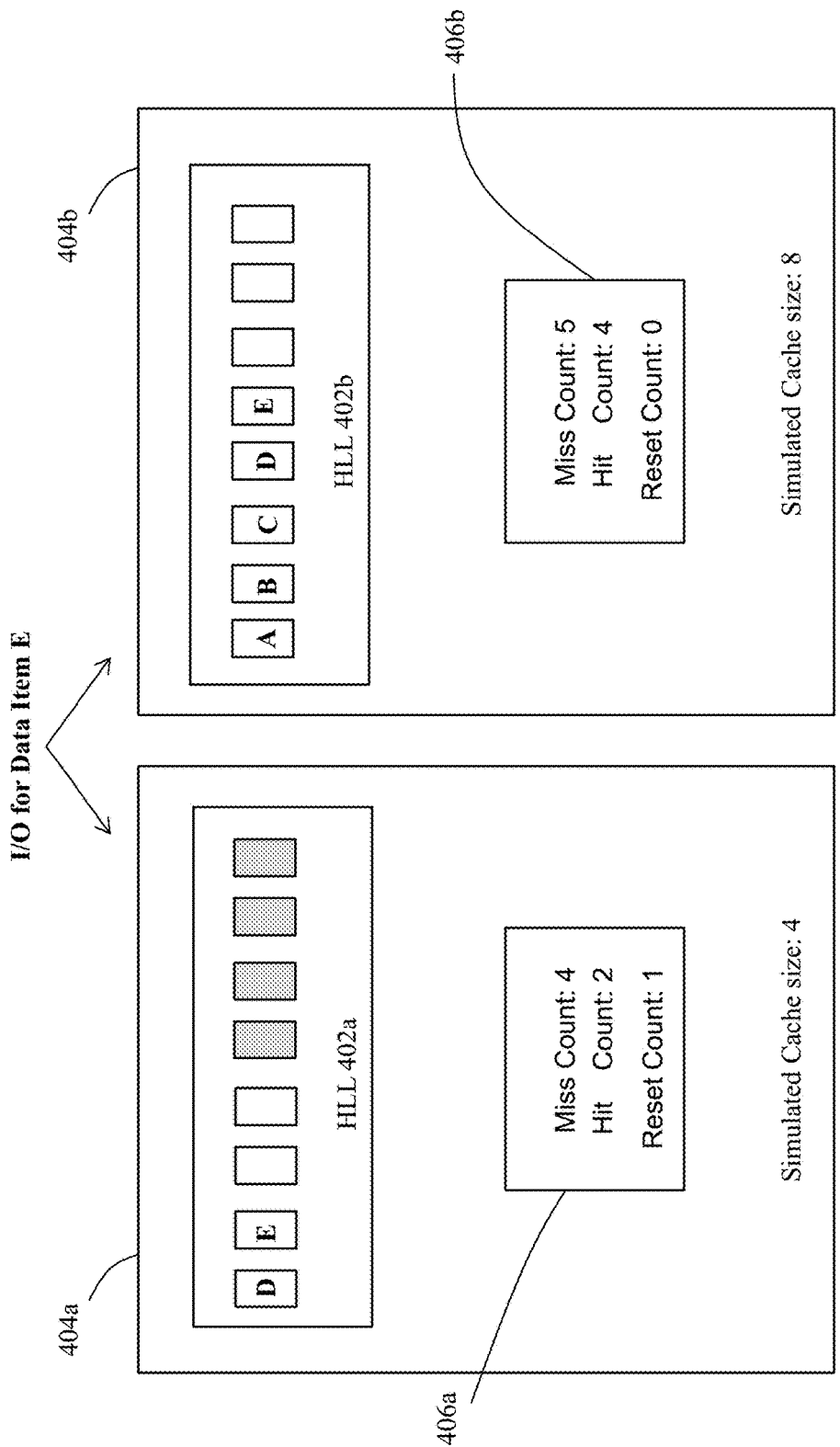
Figures 4, 5, 6, 7, 8, 9, 10, 11, 12:
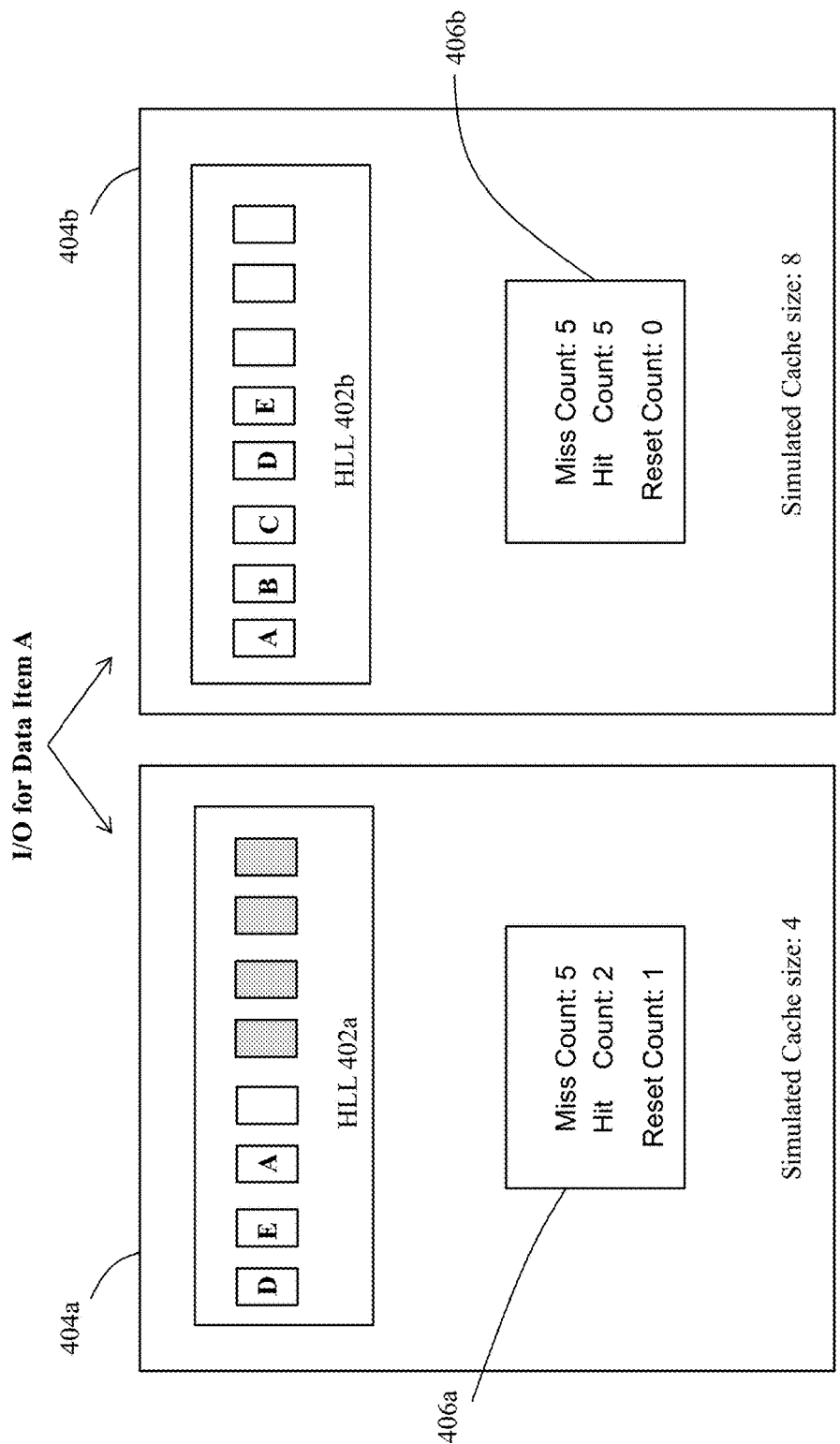
Figures 4, 5, 6, 7, 8, 9, 10, 11, 12, 13:
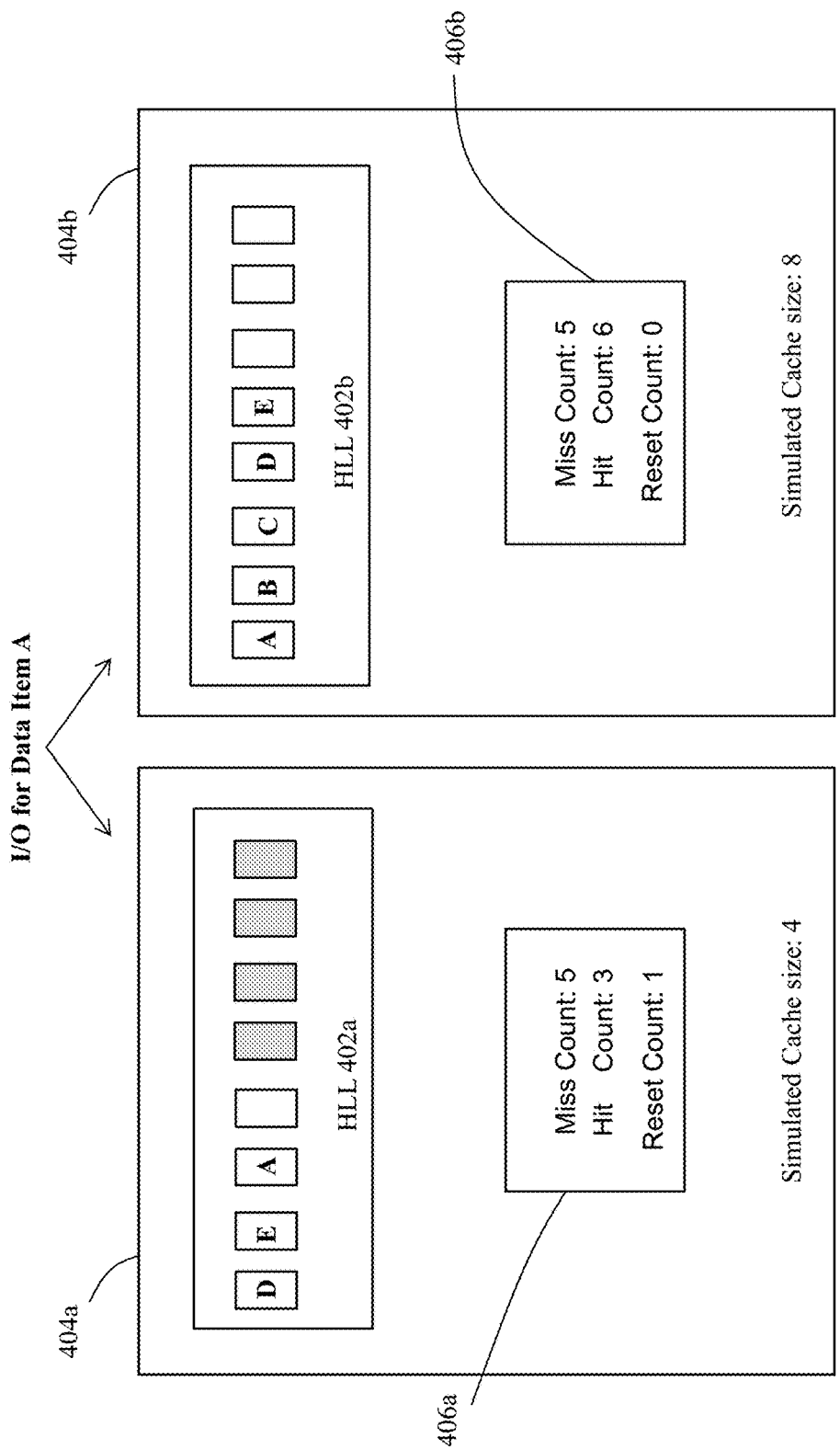
Figures 4, 5, 6, 7, 8, 9, 10, 11, 12, 13, 14:
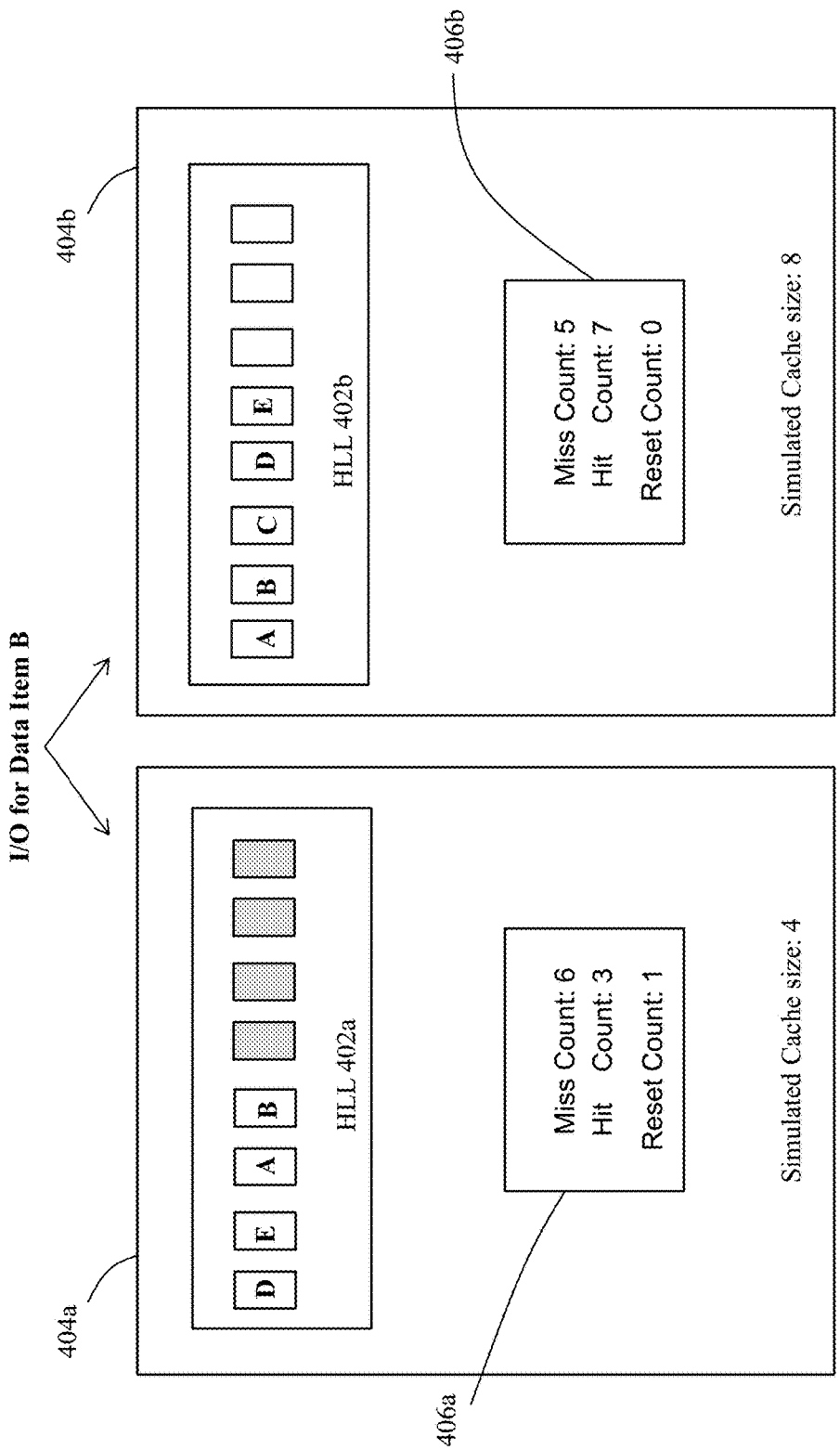
Figures 4, 5, 6, 7, 8, 9, 10, 11, 12, 13, 14, 15:
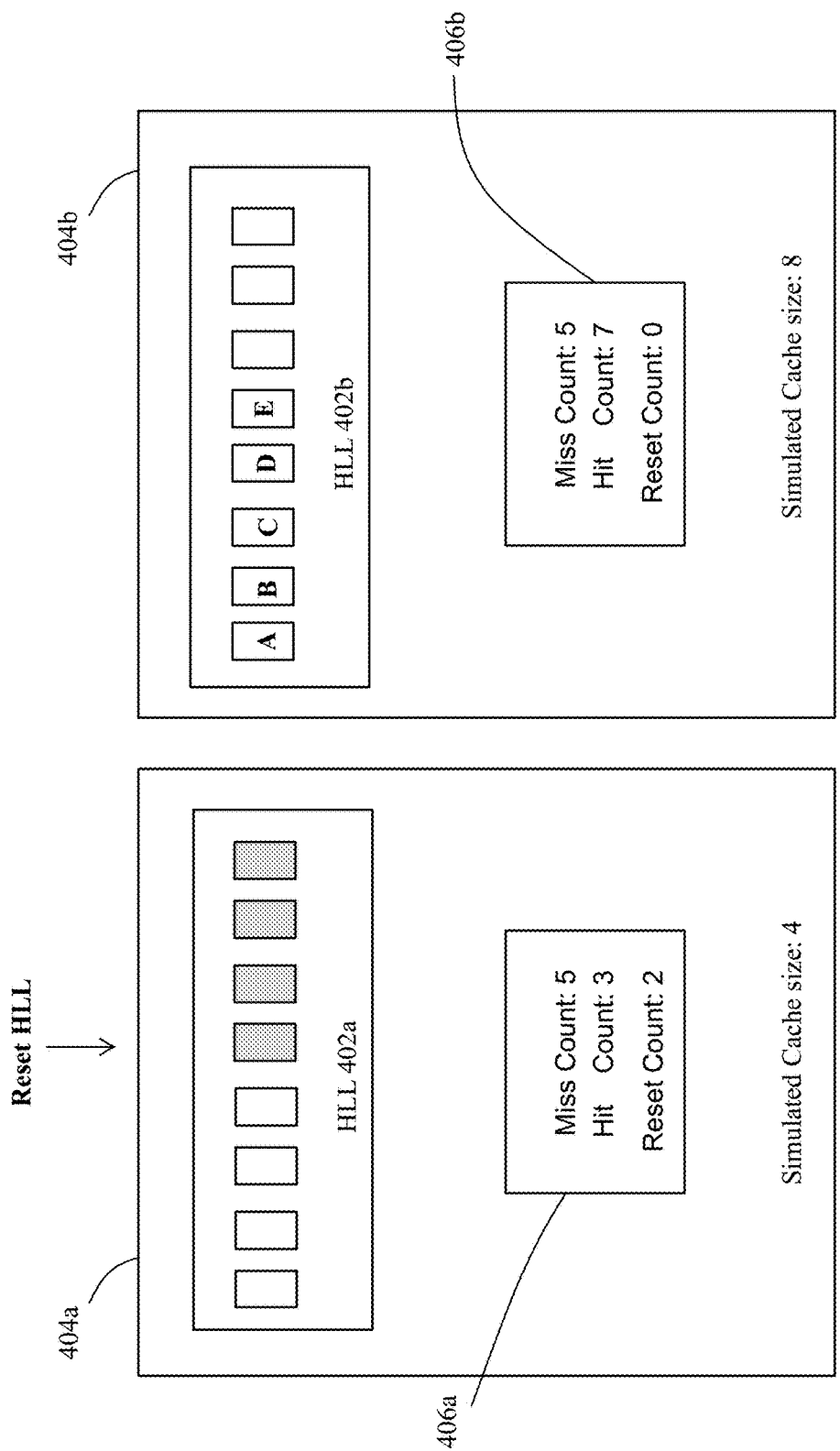
Figure 5:
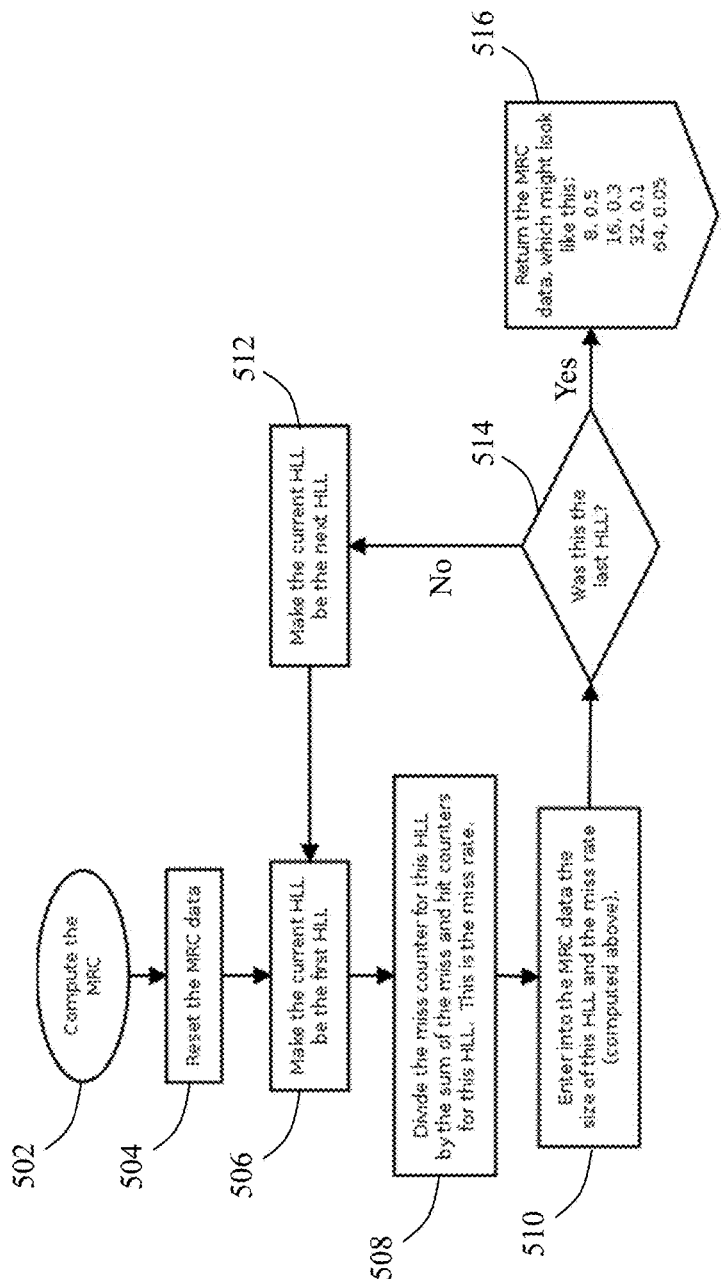
Figure 6:
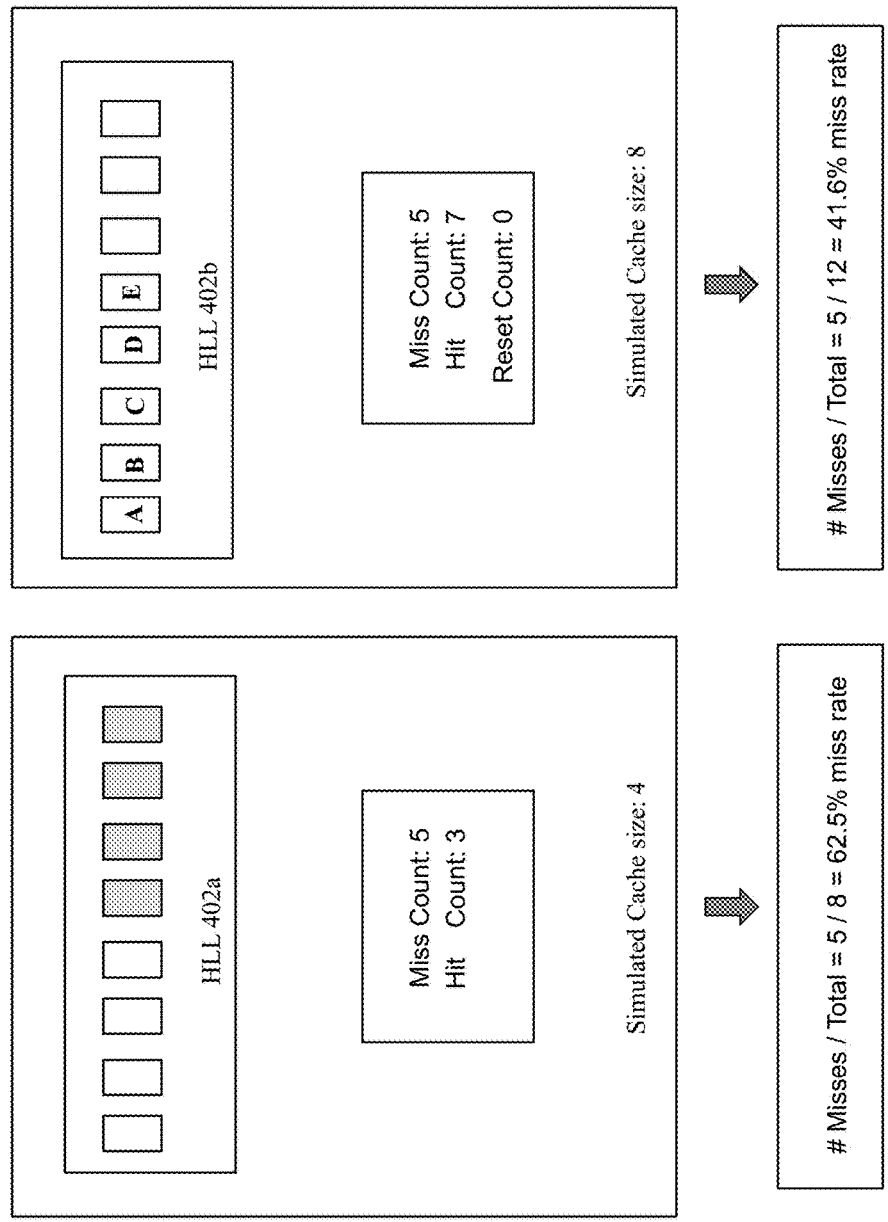
Figure 7:
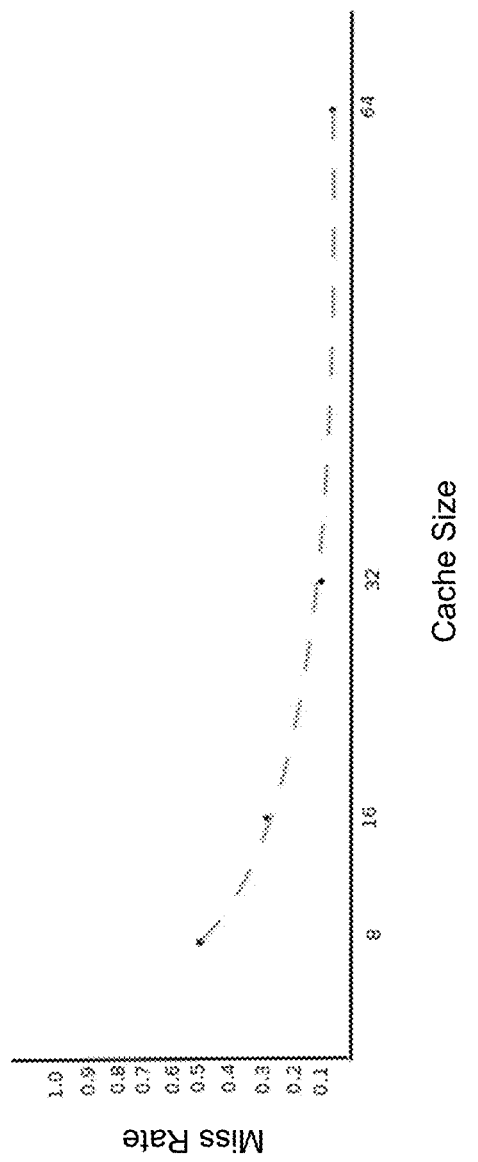
Figure 8:
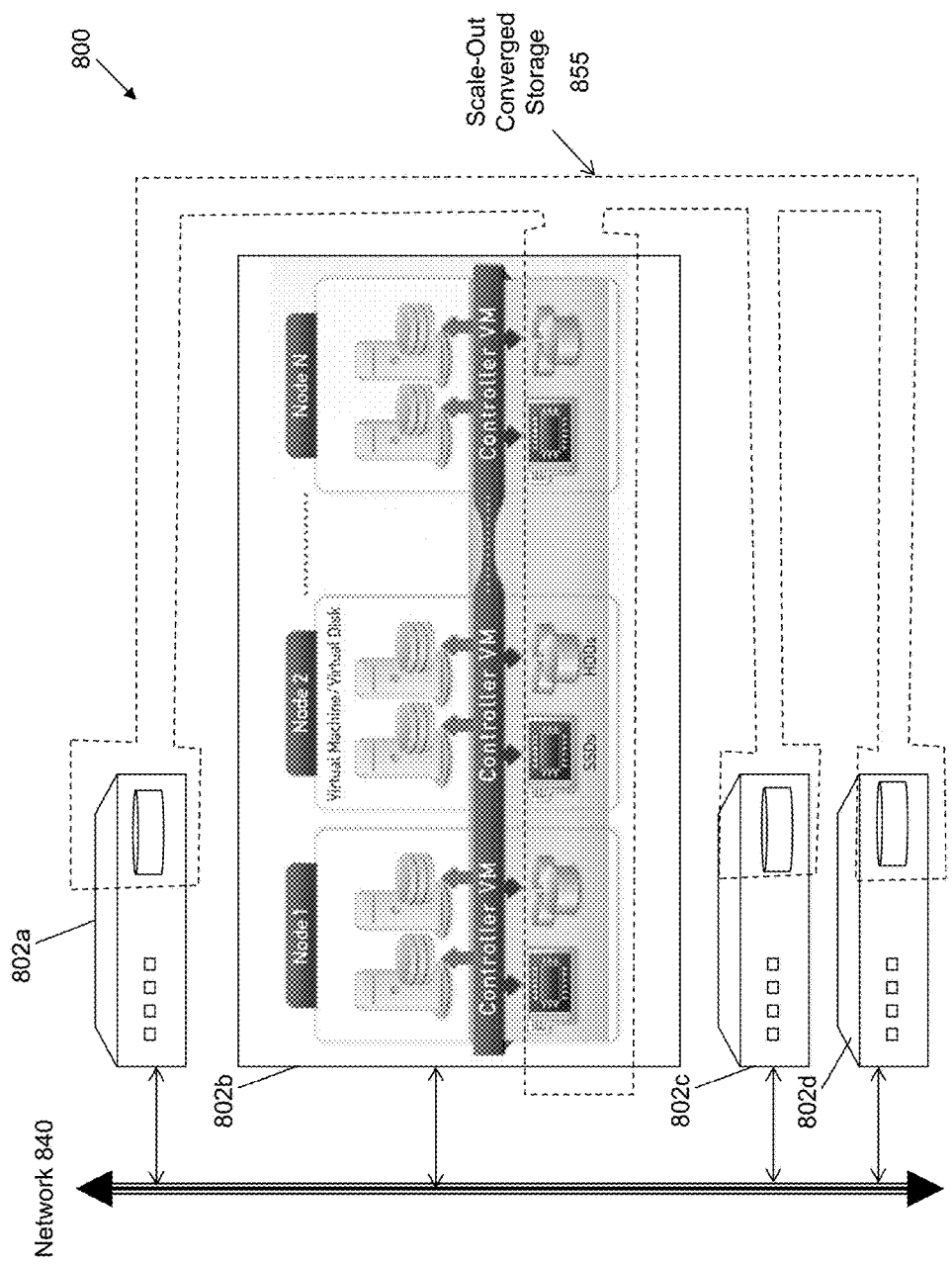
Figure 9:
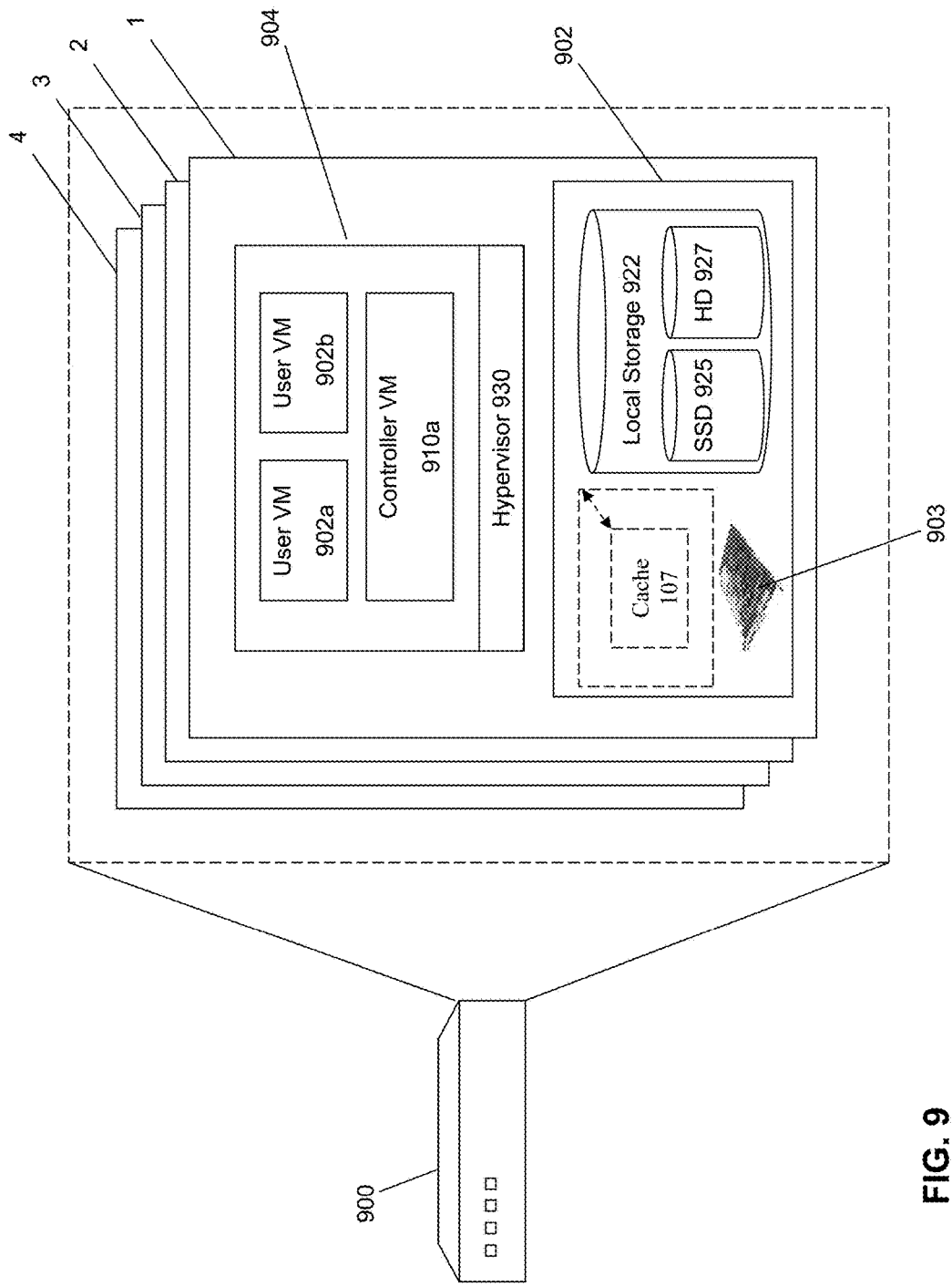
Figure 10:
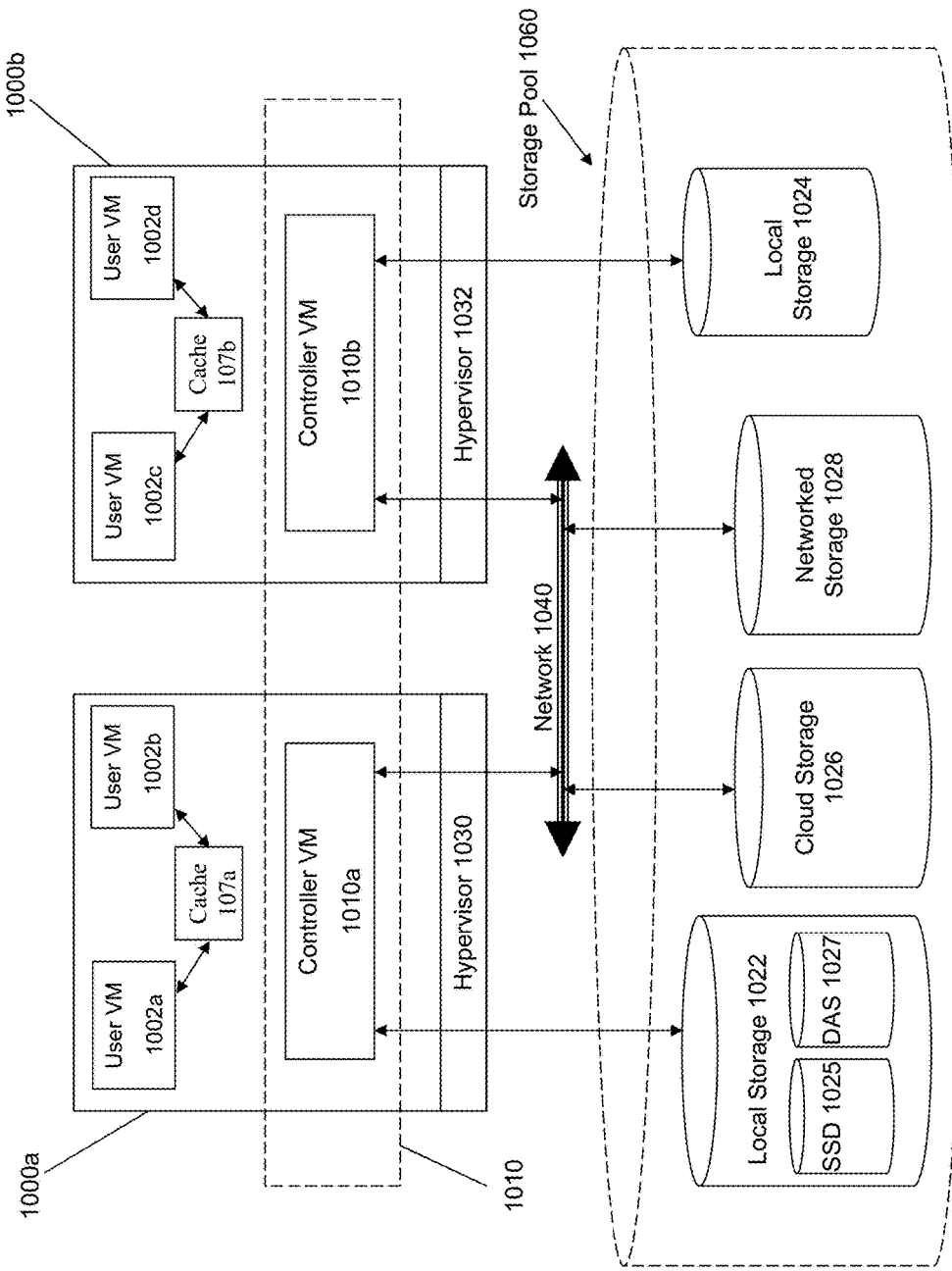
Figure 11:
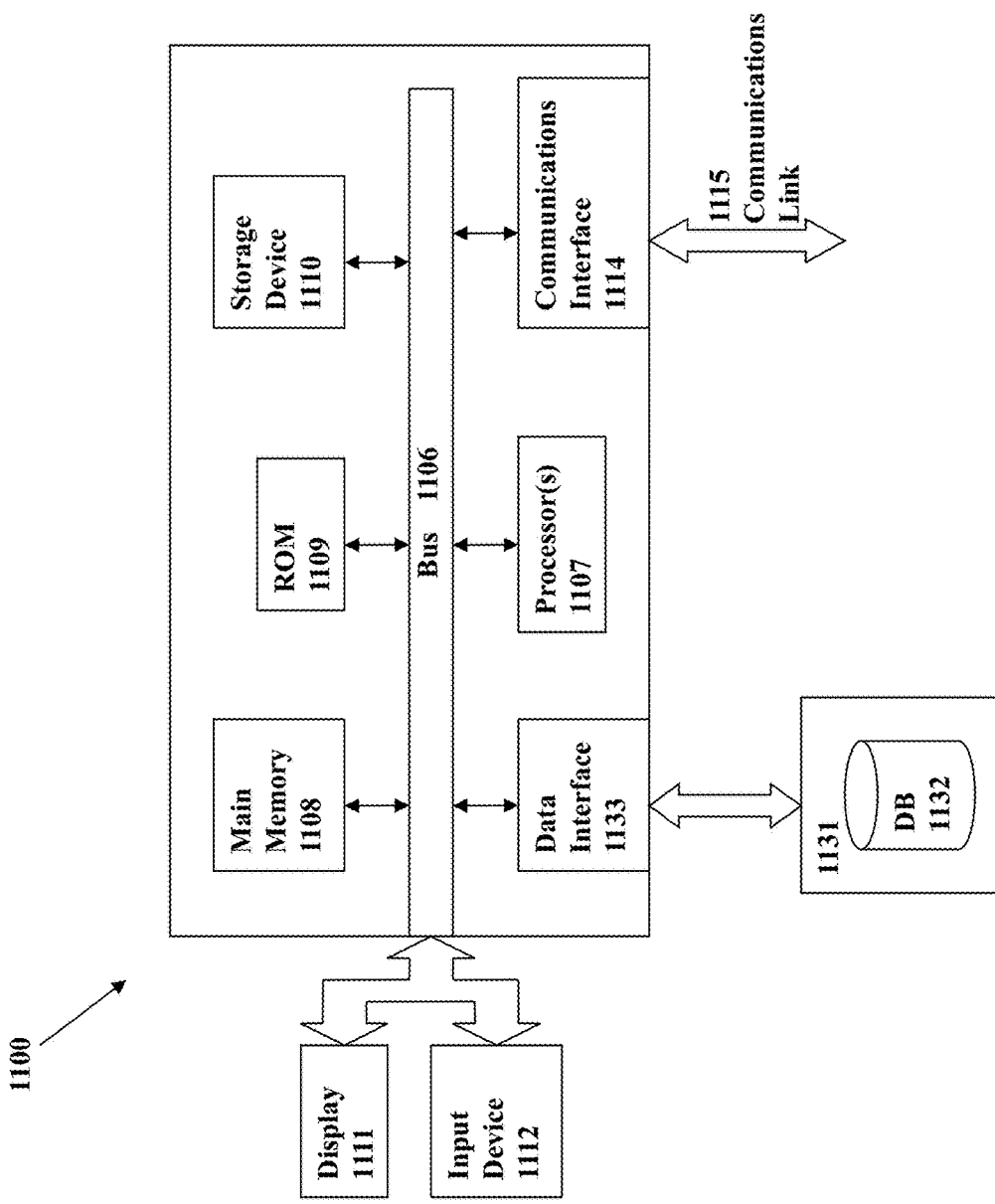

FIG. 11 is a block diagram of an illustrative computing system 1100 suitable for implementing an embodiment of the present invention. Computer system 1100 includes a bus 1106 or other communication mechanism for communicating information, which interconnects subsystems and devices, such as processor 1107, system memory 1108 (e.g., RAM), static storage device 1109 (e.g., ROM), disk drive 1110 (e.g., magnetic or optical), communication interface 1114 (e.g., modem or Ethernet card), display 1111 (e.g., CRT or LCD), input device 1112 (e.g., keyboard, cursor control), and an external data repository 1131.

According to one embodiment of the invention, computer system 1100 performs specific operations by processor 1107 executing one or more sequences of one or more instructions contained in system memory 1108. Such instructions may be read into system memory 1108 from another computer readable/usable medium, such as static storage device 1109 or disk drive 1110. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1107 for execution. Such a medium may take many forms, including but not limited to, non-volatile media and volatile media. Non-volatile media includes, for example, optical or magnetic disks, such as disk drive 1110. Volatile media includes dynamic memory, such as system memory 1108.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1100. According to other embodiments of the invention, two or more computer systems 1100 coupled by communication link 1115 (e.g., LAN, PTSN, or wireless network) may perform the sequence of instructions required to practice the invention in coordination with one another.

Computer system 1100 may transmit and receive messages, data, and instructions, including program, i.e., application code, through communication link 1115 and communication interface 1114. Received program code may be executed by processor 1107 as it is received, and/or stored in disk drive 1110, or other non-volatile storage for later execution. Computer system 1100 may communicate through a data interface 1133 to a database 1132 on an external data repository 1131. A module as used herein can be implemented using any mix of any portions of the system memory 1108, and any extent of hard-wired circuitry including hard-wired circuitry embodied as a processor 1107.

Figure 12A:
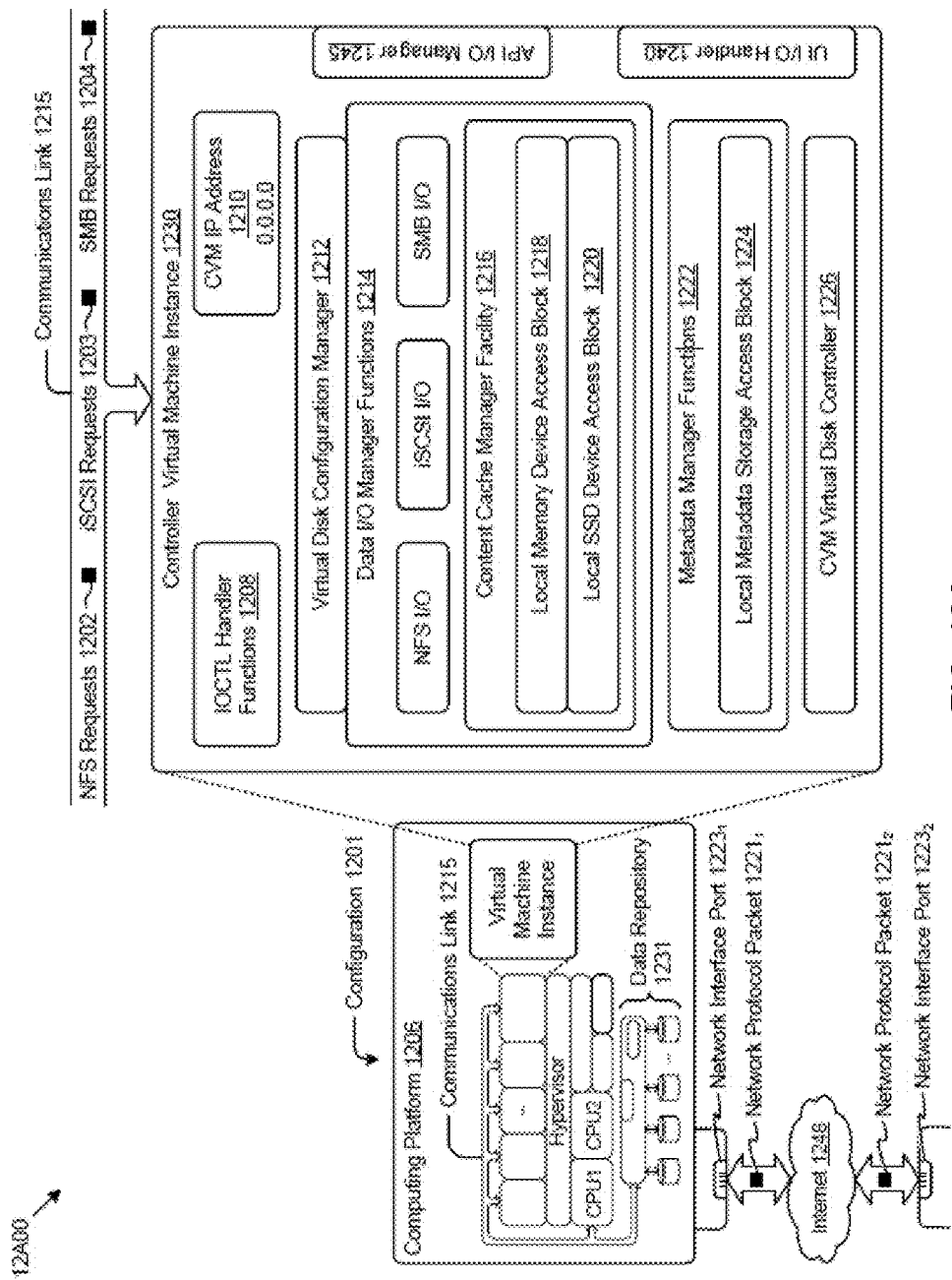
FIG. 12A and FIG. 12B depict architectures comprising collections of interconnected components suitable for implementing embodiments of the present disclosure and/or for use in the herein-described environments.

FIG. 12A depicts a virtual machine architecture 12A00 comprising a collection of interconnected components suitable for implementing embodiments of the present disclosure and/or for use in the herein-described environments. The shown virtual machine architecture 12A00 includes a virtual machine instance in a configuration 1201 that is further described as pertaining to the controller virtual machine instance 1230. A controller virtual machine instance receives block I/O (input/output or IO) storage requests as network file system (NFS) requests in the form of NFS requests 1202, and/or internet small computer storage interface (iSCSI) block IO requests in the form of iSCSI requests 1203, and/or Samba file system (SMB) requests in the form of SMB requests 1204. The controller virtual machine (CVM) instance publishes and responds to an internet protocol (IP) address (e.g., see CVM IP address 1210. Various forms of input and output (I/O or IO) can be handled by one or more IO control handler functions (see IOCTL functions 1208) that interface to other functions such as data IO manager functions 1214 and/or metadata manager functions 1222. As shown, the data IO manager functions can include communication with a virtual disk configuration manager 1212 and/or can include direct or indirect communication with any of various block IO functions (e.g., NFS IO, iSCSI IO, SMB IO, etc.).

In addition to block IO functions, the configuration 1201 supports IO of any form (e.g., block IO, streaming IO, packet-based IO, HTTP traffic, etc.) through either or both of a user interface (UI) handler such as UI IO handler 1240 and/or through any of a range of application programming interfaces (APIs), possibly through the shown API IO manager 1245.

The communications link 1215 can be configured to transmit (e.g., send, receive, signal, etc.) any types of communications packets comprising any organization of data items. The data items can comprise a payload data, a destination address (e.g., a destination IP address) and a source address (e.g., a source IP address), and can include various packet processing techniques (e.g., tunneling), encodings (e.g., encryption), and/or formatting of bit fields into fixed-length blocks or into variable length fields used to populate the payload. In some cases, packet characteristics include a version identifier, a packet or payload length, a traffic class, a flow label, etc. In some cases, the payload comprises a data structure that is encoded and/or formatted to fit into byte or word boundaries of the packet.

In some embodiments, hard-wired circuitry may be used in place of or in combination with software instructions to implement aspects of the disclosure. Thus, embodiments of the disclosure are not limited to any specific combination of hardware circuitry and/or software. In embodiments, the term "logic" shall mean any combination of software or hardware that is used to implement all or part of the disclosure.

The term "computer readable medium" or "computer usable medium" as used herein refers to any medium that participates in providing instructions to a data processor for execution. Such a medium may take many forms including, but not limited to, non-volatile media and volatile media. Non-volatile media includes any non-volatile storage medium, for example, solid state storage devices (SSDs) or optical or magnetic disks such as disk drives or tape drives. Volatile media includes dynamic memory such as a random access memory. As shown, the controller virtual machine instance 1230 includes a content cache manager facility 1216 that accesses storage locations, possibly including local dynamic random access memory (DRAM) (e.g., through the local memory device access block 1218) and/or possibly including accesses to local solid state storage (e.g., through local SSD device access block 1220).

Common forms of computer readable media include any non-transitory computer readable medium, for example, floppy disk, flexible disk, hard disk, magnetic tape, or any other magnetic medium; CD-ROM or any other optical medium; punch cards, paper tape, or any other physical medium with patterns of holes; or any RAM, PROM, EPROM, FLASH-EPROM, or any other memory chip or cartridge. Any data can be stored, for example, in any form of external data repository 1231, which in turn can be formatted into any one or more storage areas, and which can comprise parameterized storage accessible by a key (e.g., a filename, a table name, a block address, an offset address, etc.). An external data repository 1231 can store any forms of data, and may comprise a storage area dedicated to storage of metadata pertaining to the stored forms of data. In some cases, metadata, can be divided into portions. Such portions and/or cache copies can be stored in the external storage data repository and/or in a local storage area (e.g., in local DRAM areas and/or in local SSD areas). Such local storage can be accessed using functions provided by a local metadata storage access block 1224. The external data repository 1231 can be configured using a CVM virtual disk controller 1226, which can in turn manage any number or any configuration of virtual disks.

Execution of the sequences of instructions to practice certain embodiments of the disclosure are performed by a one or more instances of a processing element such as a data processor, or such as a central processing unit (e.g., CPU1, CPU2). According to certain embodiments of the disclosure, two or more instances of a configuration 1201 can be coupled by a communications link 1215 (e.g., backplane, LAN, PTSN, wired or wireless network, etc.) and each instance may perform respective portions of sequences of instructions as may be required to practice embodiments of the disclosure.

The shown computing platform 1206 is interconnected to the Internet 1248 through one or more network interface ports (e.g., network interface port $1223_1$ and network interface port $1223_2$). The configuration 1201 can be addressed through one or more network interface ports using an IP address. Any operational element within computing platform 1206 can perform sending and receiving operations using any of a range of network protocols, possibly including network protocols that send and receive packets (e.g., see network protocol packet $1221_1$ and network protocol packet $1221_2$).

The computing platform 1206 may transmit and receive messages that can be composed of configuration data, and/or any other forms of data and/or instructions organized into a data structure (e.g., communications packets). In some cases, the data structure includes program code instructions (e.g., application code) communicated through Internet 1248 and/or through any one or more instances of communications link 1215. Received program code may be processed and/or executed by a CPU as it is received and/or program code may be stored in any volatile or non-volatile storage for later execution. Program code can be transmitted via an upload (e.g., an upload from an access device over the Internet 1248 to computing platform 1206). Further, program code and/or results of executing program code can be delivered to a particular user via a download (e.g., a download from the computing platform 1206 over the Internet 1248 to an access device).

The configuration 1201 is merely one sample configuration. Other configurations or partitions can include further data processors, and/or multiple communications interfaces, and/or multiple storage devices, etc. within a partition. For example, a partition can bound a multi-core processor (e.g., possibly including embedded or co-located memory), or a partition can bound a computing cluster having plurality of computing elements, any of which computing elements are connected directly or indirectly to a communications link. A first partition can be configured to communicate to a second partition. A particular first partition and particular second partition can be congruent (e.g., in a processing element array) or can be different (e.g., comprising disjoint sets of components).

A module as used herein can be implemented using any mix of any portions of the system memory and any extent of hard-wired circuitry including hard-wired circuitry embodied as a data processor. Some embodiments include one or more special-purpose hardware components (e.g., power control, logic, sensors, transducers, etc.). A module may include one or more state machines and/or combinational logic used to implement or facilitate the operational and/or performance characteristics of multi-cluster cryptographic checksum monitoring.

Various implementations of the data repository comprise storage media organized to hold a series of records or files such that individual records or files are accessed using a name or key (e.g., a primary key or a combination of keys and/or query clauses). Such files or records can be organized into one or more data structures (e.g., data structures used to implement or facilitate aspects of multi-cluster cryptographic checksum monitoring with centralized reporting services). Such files or records can be brought into and/or stored in volatile or non-volatile memory.

Figure 12B:
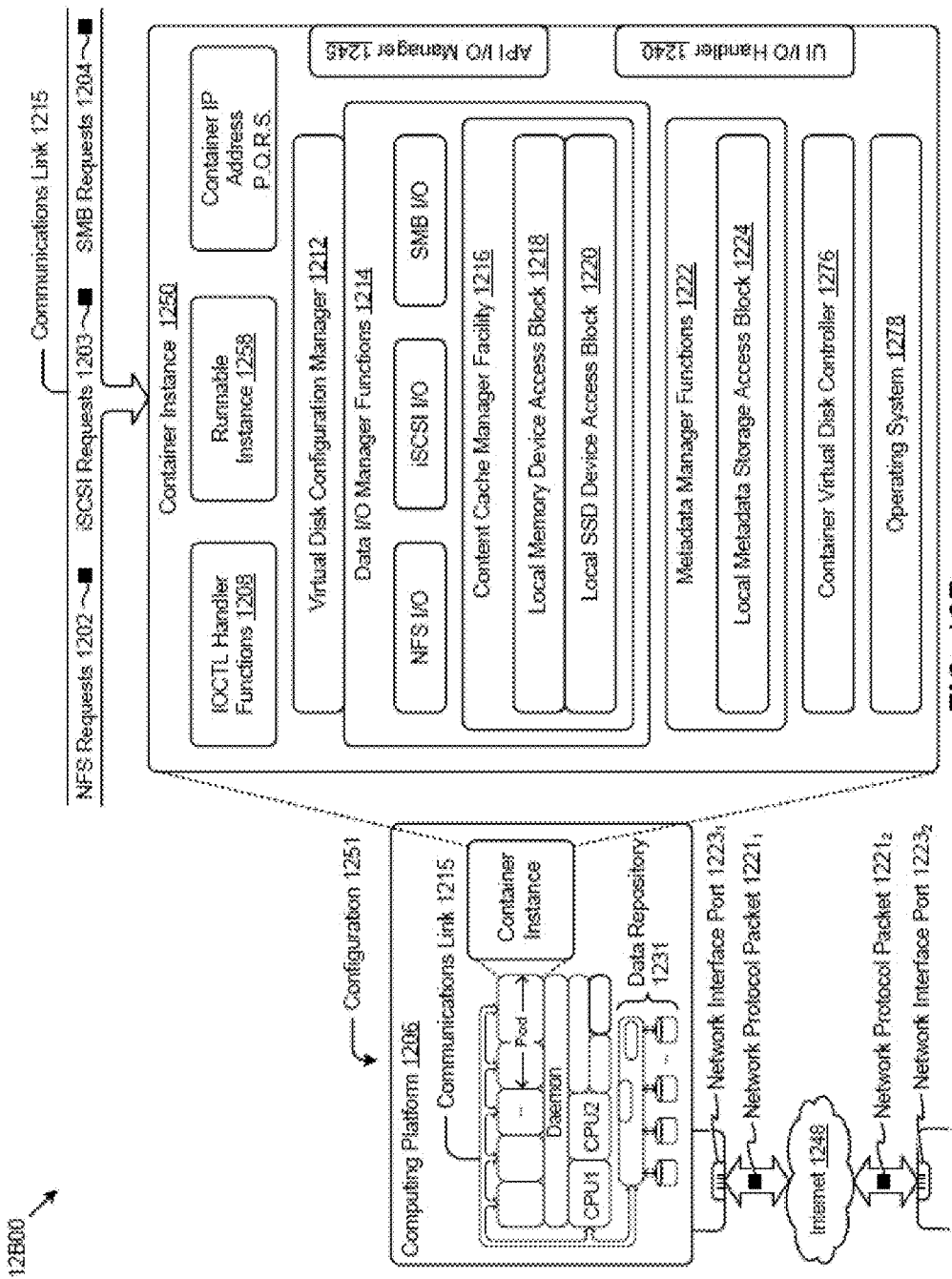

FIG. 12B depicts a containerized architecture 12B00 comprising a collection of interconnected components suitable for implementing embodiments of the present disclosure and/or for use in the herein-described environments. The shown containerized architecture 12B00 includes a container instance in a configuration 1251 that is further described as pertaining to the container instance 1250. The configuration 1251 includes a daemon (as shown) that performs addressing functions such as providing access to external requestors via an IP address (e.g., "P.Q.R.S", as shown). Providing access to external requestors can include implementing all or portions of a protocol specification (e.g., "http:") and possibly handling port-specific functions.

The daemon can perform port forwarding to any container (e.g., container instance 1250). A container instance can be executed by a processor. Runnable portions of a container instance sometimes derive from a container image, which in turn might include all, or portions of any of, a Java archive repository (JAR) and/or its contents, a script or scripts and/or a directory of scripts, a virtual machine configuration, and may include any dependencies therefrom. In some cases, a virtual machine configuration within a container might include an image comprising a minimum set of runnable code. Contents of larger libraries and/or code or data that would not be accessed during runtime of the container instance can be omitted from the larger library to form a smaller library composed of only the code or data that would be accessed during runtime of the container instance. In some cases, start-up time for a container instance can be much faster than start-up time for a virtual machine instance, at least inasmuch as the container image might be much smaller than a respective virtual machine instance. Furthermore, start-up time for a container instance can be much faster than start-up time for a virtual machine instance, at least inasmuch as the container image might have many fewer code and/or data initialization steps to perform than a respective virtual machine instance.

A container (e.g., a Docker container) can be rooted in a directory system, and can be accessed by file system commands (e.g., "ls" or "ls -a", etc.). The container might optionally include an operating system 1278, however such an operating system need not be provided. Instead, a container can include a runnable instance 1258, which is built (e.g., through compilation and linking, or just-in-time compilation, etc.) to include all of the library and OS-like functions needed for execution of the runnable instance. In some cases, a runnable instance can be built with a virtual disk configuration manager, any of a variety of data IO management functions, etc. In some cases, a runnable instance includes code for, and access to, a container virtual disk controller 1276. Such a container virtual disk controller can perform any of the functions that the aforementioned CVM virtual disk controller 1226 can perform, yet such a container virtual disk controller does not rely on a hypervisor or any particular operating system so as to perform its range of functions.

In some environments multiple containers can be collocated and/or share one or more context. For example, multiple containers that share access to a virtual disk can be assembled into a pod (e.g., a Kubernetes pod). Pods provide sharing mechanisms (e.g., when multiple containers are amalgamated into the scope of a pod) as well as isolation mechanisms (e.g., such that the namespace scope of one pod does not share the namespace scope of another pod).

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method implemented with a processor for performing cache estimation, comprising:
    generating a list of cache sizes, the list of cache sizes corresponding to different sizes of caches, the caches comprising one or more storage components;
    initializing a hyperloglog (HLL) for each cache size on the list of cache sizes, wherein a first HLL is initialized for a first cache having a first cache size and a second HLL is initialized for a second cache having a second cache size, wherein the first cache size is different than the second cache size;
    performing cache estimation using the HLL by representing a change of state of the HLL as a cache miss and a non-change of state of the HLL as a cache hit;
    computing, using the HLL, a miss rate curve (MRC) from a count of the cache miss and the cache hit; and
    changing a size of a cache based at least in part on a MRC value determined from the MRC computed by the HLL.

2. The method of claim 1, wherein the HLL comprises a fixed amount of memory regardless of a cache size being simulated.

3. The method of claim 1, wherein a miss counter tracks the count of the cache miss and a hit counter tracks the count of the cache hit.

4. The method of claim 1, wherein a reset of the HLL occurs when the HLL is full.

5. The method of claim 4, wherein tracking of the count of the cache miss or cache hit does not occur immediately after the reset.

6. The method of claim 5, wherein tracking of the count of the cache miss or cache hit occurs after the reset when the HLL becomes more than half full.

7. The method of claim 1, wherein the MRC is determined by calculating a miss counter value divided by a sum of the miss counter value and a hit counter value.

8. The method of claim 1, further comprising selection of a cache size from the MRC.

9. The method of claim 1, wherein the cache estimation is for a cache in a virtualization system.

10. The method of claim 9, wherein the cache is within a computing node operating a hypervisor and one or more virtual machines.

11. A computer program product embodied on a computer readable medium, the computer readable medium having stored thereon a sequence of instructions which, when executed by a processor causes the processor to execute a method for implementing cache estimation, the method comprising:
    generating a list of cache sizes, the list of cache sizes corresponding to different sizes of caches, the caches comprising one or more storage components;
    initializing a hyperloglog (HLL) for each cache size on the list of cache sizes, wherein a first HLL is initialized for a first cache having a first cache size and a second HLL is initialized for a second cache having a second cache size, wherein the first cache size is different than the second cache size;
    performing cache estimation using the HLL by representing a change of state of the HLL as a cache miss and a non-change of state of the HLL as a cache;
    computing, using the HLL, a miss rate curve (MRC) from a count of the cache miss and the cache hit; and
    changing a size of a cache based at least in part on a MRC value determined from the MRC computed by the HLL.

12. The computer program product of claim 11, wherein the HLL comprises a fixed amount of memory regardless of a cache size being simulated.

13. The computer program product of claim 11, wherein a miss counter tracks the count of the cache miss and a hit counter tracks the count of the cache hit.

14. The computer program product of claim 11, wherein a reset of the HLL occurs when the HLL is full.

15. The computer program product of claim 14, wherein tracking of the count of the cache miss or cache hit does not occur immediately after the reset.

16. The computer program product of claim 15, wherein tracking of the count of the cache miss or cache hit occurs after the reset when the HLL becomes more than half full.

17. The computer program product of claim 11, wherein the MRC is determined by calculating a miss counter value divided by a sum of the miss counter value and a hit counter value.

18. The computer program product of claim 11, wherein the computer readable medium further comprises instructions which, when executed by the processor causes the processor to execute selection of a cache size from the MRC.

19. The computer program product of claim 11, wherein the cache estimation is for a cache in a virtualization system.

20. The computer program product of claim 19, wherein the cache is within a computing node operating a hypervisor and one or more virtual machines.

21. A system for performing cache estimation, comprising:
    a computer processor to execute a set of program code instructions; and
    a memory to hold the program code instructions, in which the program code instructions comprises program code to perform: generating a list of cache sizes, the list of cache sizes corresponding to different sizes of caches, the caches comprising one or more storage components; initializing a hyperloglog (HLL) for each cache size on the list of cache sizes, wherein a first HLL is initialized for a first cache having a first cache size and a second HLL is initialized for a second cache having a second cache size, wherein the first cache size is different than the second cache size; performing cache estimation using the HLL by representing a change of state of the HLL as a cache miss and a non-change of state of the HLL as a cache hit; computing, using the HLL, a miss rate curve (MRC) from a count of the cache miss and the cache hit; and changing a size of a cache based at least in part on a MRC value determined from the MRC computed by the HLL.

22. The system of claim 21, wherein the HLL comprises a fixed amount of memory regardless of a cache size being simulated.

23. The system of claim 21, wherein a miss counter tracks the count of the cache miss and a hit counter tracks the count of the cache hit.

24. The system of claim 21, wherein a reset of the HLL occurs when the HLL is full.

25. The system of claim 24, wherein tracking of the count of the cache miss or cache hit does not occur immediately after the reset.

26. The system of claim 25, wherein tracking of the count of the cache miss or cache hit occurs after the reset when the HLL becomes more than half full.

27. The system of claim 21, wherein the MRC is determined by calculating a miss counter value divided by a sum of the miss counter value and a hit counter value.

28. The system of claim 21, wherein the program code instructions further comprise program code to perform selection of a cache size from the MRC.

29. The system of claim 21, wherein the cache estimation is for a cache in a virtualization system.

30. The system of claim 29, wherein the cache is within a computing node operating a hypervisor and one or more virtual machines.

\* \* \* \* \*